United States Patent
Lee et al.

(10) Patent No.: US 11,735,638 B2
(45) Date of Patent: Aug. 22, 2023

(54) THIN FILM TRANSISTOR ARRAY SUBSTRATE AND ELECTRONIC DEVICE INCLUDING THE SAME

(71) Applicant: LG Display Co., Ltd., Seoul (KR)

(72) Inventors: Dohyung Lee, Paju-si (KR); JuHeyuck Baeck, Paju-si (KR); ChanYong Jeong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/505,115

(22) Filed: Oct. 19, 2021

(65) Prior Publication Data
US 2022/0123120 A1   Apr. 21, 2022

(30) Foreign Application Priority Data
Oct. 20, 2020   (KR) .......................... 10-2020-0135818

(51) Int. Cl.
*H01L 29/423* (2006.01)
*H01L 27/146* (2006.01)
*H01L 29/43* (2006.01)

(52) U.S. Cl.
CPC .. *H01L 29/42376* (2013.01); *H01L 27/14614* (2013.01); *H01L 29/42384* (2013.01); *H01L 29/435* (2013.01)

(58) Field of Classification Search
CPC ....... H01L 29/43; H01L 29/49; H01L 29/423; H01L 29/435; H01L 29/786; H01L 29/7869; H01L 29/78696; H01L 29/42384; H01L 29/42376; H01L 27/12; H01L 27/146; H01L 27/1237; H01L 27/1222; H01L 27/124; H01L 27/1225; H01L 27/14614; H10L 59/121; H10L 59/1213
USPC ......................................................... 257/330
See application file for complete search history.

(56) References Cited

U.S. PATENT DOCUMENTS 11,482,623 B2 * 10/2022  Baeck ............... H01L 29/78696
2021/0193838 A1 *  6/2021  Ko .................... H01L 29/78603

* cited by examiner

*Primary Examiner* — Chuong A Luu
(74) *Attorney, Agent, or Firm* — Fenwick & West LLP

(57) ABSTRACT

A thin film transistor array substrate and an electronic device including the thin film transistor array are disclosed. The thin film transistor comprises a substrate, a first active layer on the substrate, a gate electrode on the first active layer, a second active layer on the gate electrode such that the gate electrode is between the first active layer and the second active layer. The gate electrode is configured to drive the first active layer and the second active layer. Thereby, it is possible to provide the thin film transistor array substrate including one or more thin film transistors having high current characteristics in a small area, and the electronic device including the thin film transistor array substrate.

23 Claims, 18 Drawing Sheets

THIN FILM TRANSISTOR ARRAY SUBSTRATE AND ELECTRONIC DEVICE INCLUDING THE SAME

CROSS-REFERENCE TO RELATED APPLICATION

This application claims the priority benefit of Republic of Korea Patent Application No. 10-2020-0135818, filed on Oct. 20, 2020 in the Korean Intellectual Property Office, the disclosure of which is hereby incorporated by reference in its entirety.

BACKGROUND

Field of the Disclosure

The present disclosure relates to a thin film transistor array substrate and an electronic device including the thin film transistor array substrate.

Description of the Background

As the advent of information society, there have been growing needs for various types of electronic devices, such as display devices, lighting devices, and the like are. Such electronic devices include a panel in which data lines and gate lines are disposed, a data driver for driving the data lines, and a gate driver for driving the gate lines.

Generally, a plurality of transistors with various functions for driving are arranged in the panel that is a core element of such electronic devices.

Due to this, a process of manufacturing the panel becomes inevitably complicated and difficult. Meanwhile, in case of focusing on process convenience, the performance of circuit components such as transistors, and the like can be deteriorated.

In addition, in order to implement excellent characteristics of an electronic device such as high resolution, a degree to which transistors are integrated is needed to be increased, and characteristics of circuit components for implementing high resolution are needed to be satisfied. However, since a size of the transistors cannot be reduced unlimitedly due to substantial limitations on a manufacturing process, design, or the like, there is a need to provide transistors having a structure capable of being disposed with a high degree of integration and manufactured in a simple process in an electronic device without deteriorating the characteristics of the transistors.

SUMMARY

Embodiments of the present disclosure provide to a thin film transistor array substrate capable of exhibiting high current characteristics by allowing one thin film transistor to include a first active layer and a second active layer disposed on the first active layer, and an electronic device including the thin film transistor array substrate.

Embodiments of the present disclosure provide to a thin film transistor substrate capable of reducing the number of processes by allowing each of first and second electrodes to contact a part of at least one active layer of a thin film transistor, and an electronic device including the thin film transistor array substrate.

Embodiments of the present disclosure provide a thin film transistor array substrate that allows a thin film transistor having high current characteristics to occupy a smaller area, and a narrow bezel to be realized by disposing, in a non-active area.

In one embodiment, an electronic device comprises: a panel including at least one thin film transistor and a driving circuit configured to drive the panel. The panel comprises: a substrate; a first active layer disposed over the substrate, the first active layer including a first region, a second region spaced apart from the first region, and a first channel region disposed between the first region and the second region; a first gate insulating film disposed on the first active layer; a gate electrode disposed on the first gate insulating film; a second gate insulating film disposed on the gate electrode; a second active layer comprising at least one layer and disposed on the second gate insulating film such that the second active layer overlaps the gate electrode, the second active layer including a third region, a fourth region spaced apart from the third region, and a second channel region disposed between the third region and the fourth region; a first electrode disposed on the third region of the second active layer; and a second electrode spaced apart from the first electrode, disposed on the fourth region of the second active layer.

In one embodiment, a thin film transistor comprises: a substrate; a first active layer on the substrate; a gate electrode on the first active layer; a second active layer on the gate electrode such that the gate electrode is between the first active layer and the second active layer, wherein the gate electrode is configured to drive the first active layer and the second active layer.

DETAILED DESCRIPTION

Figure 1:
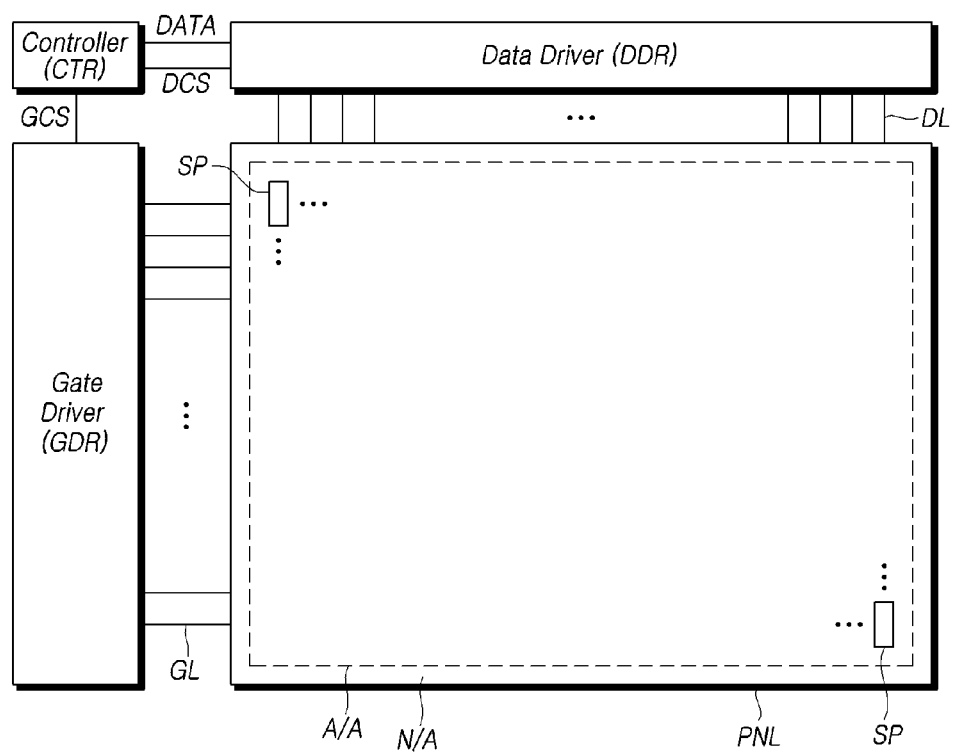
FIG. 1 schematically illustrates a system configuration of an electronic device according to one embodiment of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, exemplary embodiments of the present disclosure will be described in detail with reference to the accompanying drawings.

FIG. 1 schematically illustrates a system configuration of an electronic device according to one embodiment of the present disclosure.

Electronic devices according to aspects of the present disclosure may include a display device, a lighting device, a light emitting device, and the like. Hereinafter, for convenience of description, embodiments of the present disclosure will be described by focusing on display devices. However, it should be appreciated that as long as a transistor is included, embodiments described herein may be applicable to other various electronic devices, such as lighting devices, light emitting devices, and the like, as well as display devices.

The electronic device according to aspects of the present disclosure includes a panel PNL that displays an image or outputs light, and a driving circuit for driving the panel PNL.

The panel PNL may include a plurality of data lines DL and a plurality of gate lines GL, and a plurality of sub-pixels SP defined by the plurality of data lines DL and the plurality of gate lines GL, and arranged in a matrix pattern.

The plurality of data lines DL and the plurality of gate lines GL may be arranged to intersect each other in the panel PNL. In an embodiment, the plurality of gate lines GL may be arranged in rows or columns, and the plurality of data lines DL may be arranged in columns or rows. Hereinafter, for convenience of description and ease of understanding, it is assumed that the plurality of gate lines GL is arranged in rows and the plurality of data lines DL is arranged in columns.

In addition to the plurality of data lines DL and the plurality of gate lines GL, one or more other types of signal lines may be arranged in the panel PNL according to sub-pixel structures or the like. A driving voltage line, a reference voltage line, or a common voltage line may be further disposed.

The panel PNL may be one of various types of panels, such as a liquid crystal display (LCD) panel, an organic light emitting diode (OLED) panel, an electroluminescence display (ELD) panel, a quantum-dot (QD) light emitting display panel, and the like.

The types of signal lines arranged on the panel PNL may be different depending on a sub-pixel structure, a panel type (e.g., an LCD panel, an OLED panel, etc.), and the like. Herein, the signal lines may include an electrode to which a signal is applied. In an embodiment, at least a part of the signal lines may serve as an electrode to which a signal is applied.

The panel PNL can include an active area A/A on which images are displayed, and a non-active area N/A that is an outer edge, on which images are not displayed. Here, the non-active area N/A is sometimes referred to as a bezel area.

A plurality of sub-pixels SP for image display are arranged in the active area A/A.

A pad portion including one or more conductive pads may be disposed in the non-active area N/A for an electrically connection with a data driver DDR, and a plurality of data link lines may be disposed in the non-active area N/A for electrically connecting between the pad portion and a plurality of data lines DL. Here, the plurality of data link lines may be parts of the plurality of data lines DL extending up to the non-active area N/A (e.g., from the active area A/A), or may be separate patterns electrically connected to the plurality of data lines DL.

Further, gate driving related lines may be arranged in the non-active area N/A to transmit a voltage (signal) needed for gate driving to a gate driver GDR through the pad portion to which the gate driver GDR is electrically connected. In an embodiment, such gate driving related lines may include clock lines for carrying clock signals, gate voltage lines for transmitting gate voltages (VGH, VGL), and gate driving control signal lines for carrying various types of control signals required for generating scan signals. The gate driving related lines may be arranged in the non-active area N/A, differently from the gate lines GL disposed in the active area A/A.

The driving circuit may include a data driver DDR for driving a plurality of data lines DL, a gate driver GDR for driving a plurality of gate lines GL, and a controller CTR for controlling the data driver DDR and the gate driver GDR.

The data driver DDR can drive the plurality of data lines DL by applying data voltages to the plurality of data lines DL.

The gate driver GDR can drive the plurality of gate lines GL by supplying scan signals to the plurality of gate lines GL.

The controller CT can control driving operations of the data driver DDR and the gate driver GDR by supplying various types of control signals (DCS, GCS) required for the driving operations of the data driver DDR and the gate driver GDR. Further, the controller CTR can supply image data DATA to the data driver DDR.

The controller CTR can start to scan a pixel according to a timing scheduled in each frame, convert image data inputted from the outside (e.g., a host system, other devices or other image providing sources) to a data signal type used in the data driver DDR and then output image data DATA resulting from the converting to the data driver DDR, and causes the data to be written into the pixel at a preconfigured time according to scan operation.

To control the data driver DDR and the gate driver GDR, the controller CTR can receive, from the outside (e.g., the host system, other devices or other image providing sources), timing signals, such as, a vertical synchronization signal Vsync, a horizontal synchronization signal Hsync, an input data enable (Data Enable) signal, a clock signal, and the like. The controller CTR can generate various types of control signals using the received signals and supply such generated signals to the data driver DDR and the gate driver GDR.

In an embodiment, to control the gate driver GDR, the controller CTR can output several types of gate control signals GCS including a gate start pulse GSP, a gate shift clock GSC, a gate output enable signal GOE, and the like.

Further, to control the data driver DDR, the controller CTR can output several types of data control signals DCS including a source start pulse SSP, a source sampling clock SSC, a source output enable signal SOE, and the like.

The controller CTR may be a timing controller used in the typical display technology or a control apparatus/device capable of additionally performing other control functions in addition to the typical function of the timing controller.

The controller CTR may be implemented in a separate component from the data driver DDR or may be integrated with the data driver DDR into an integrated circuit.

The data driver DDR can drive a plurality of data lines DL by receiving image data DATA from the controller CTR and then supplying data voltages corresponding to the image data to the plurality of data lines DL. Here, the data driver DDR is sometimes referred to as a source driving circuit or a source driver.

The data driver DDR can transmit various signals to, or receive various signals from, the controller CTR through various interfaces.

The gate driver GDR can sequentially drive a plurality of gate lines GL by sequentially supplying scan signals to the plurality of gate lines GL. Here, the gate driver GDR is sometimes referred to as a scan driving circuit or a scan driver.

According to the control of the controller CTR, the gate driver GDR can sequentially supply scan signals representing an on-voltage or an off-voltage to the plurality of gate lines GL.

When a specific gate line is asserted by a scan signal from the gate driver GDR, the data driver DDR can convert image data DATA received from the controller CTR into analog data voltages and supply the obtained data voltages to the plurality of data lines DL.

The data driver DDR may be located on, but not limited to, only one side (e.g., an upper side or a lower side) of the panel PNL, or in some embodiments, be located on, but not limited to, two sides (e.g., the upper side and the lower side) of the panel PNL according to driving schemes, design schemes of the panels, or the like.

The gate driver GDR may be located on, but not limited to, only one side (e.g., a left side or a right side) of the panel PNL, or in some embodiments, be located on, but not limited to, two sides (e.g., the left side and the right side) of the panel PNL according to driving schemes, design schemes of the panels, or the like.

The data driver DDR may be implemented by including one or more source driver integrated circuits SDIC.

Each source driver integrated circuit SDIC may include a shift register, a latch circuit, a digital-to-analog converter DAC, an output buffer, and the like. In some embodiments, the data driver DDR may further include one or more analog-to-digital converters ADC.

Each source driver integrated circuit SDIC may be connected to a conductive pad such as a bonding pad of the panel PNL in a tape automated bonding (TAB) type or a chip on glass (COG) type, or be directly disposed on the panel 110. In some embodiments, each source driver integrated circuit SDIC may be disposed in the panel PNL in an integrated type. In some embodiments, each source driver integrated circuit SDIC may be implemented in a chip on film (COF) type. In this embodiment, each source driver integrated circuit SDIC may be mounted on a circuit film, and electrically connected to data lines DL in the panel PNL through the circuit film.

The gate driver GDR may include a plurality of gate driving circuits GDC. The plurality of gate driving circuits GDC may correspond to a plurality of gate lines GL, respectively.

Each gate driving circuit GDC may include a shift register, a level shifter, and the like.

Each gate driving circuit GDC may be connected to a conductive pad such as a bonding pad of the panel PNL in the tape automated bonding (TAB) type or the chip on glass (COG) type. In some embodiments, each gate driving circuit GDC may be implemented in the chip on film (COF) type. In this embodiment, each gate driving circuit GDC may be mounted on a circuit film, and electrically connected to gate lines GL in the panel PNL through the circuit film. In another embodiment, each gate driving circuit GDC may be implemented in a gate in panel (GIP) type and embedded in the panel PNL. That is, each gate driving circuit GDC may be directly formed in the panel PNL.

Figure 2:
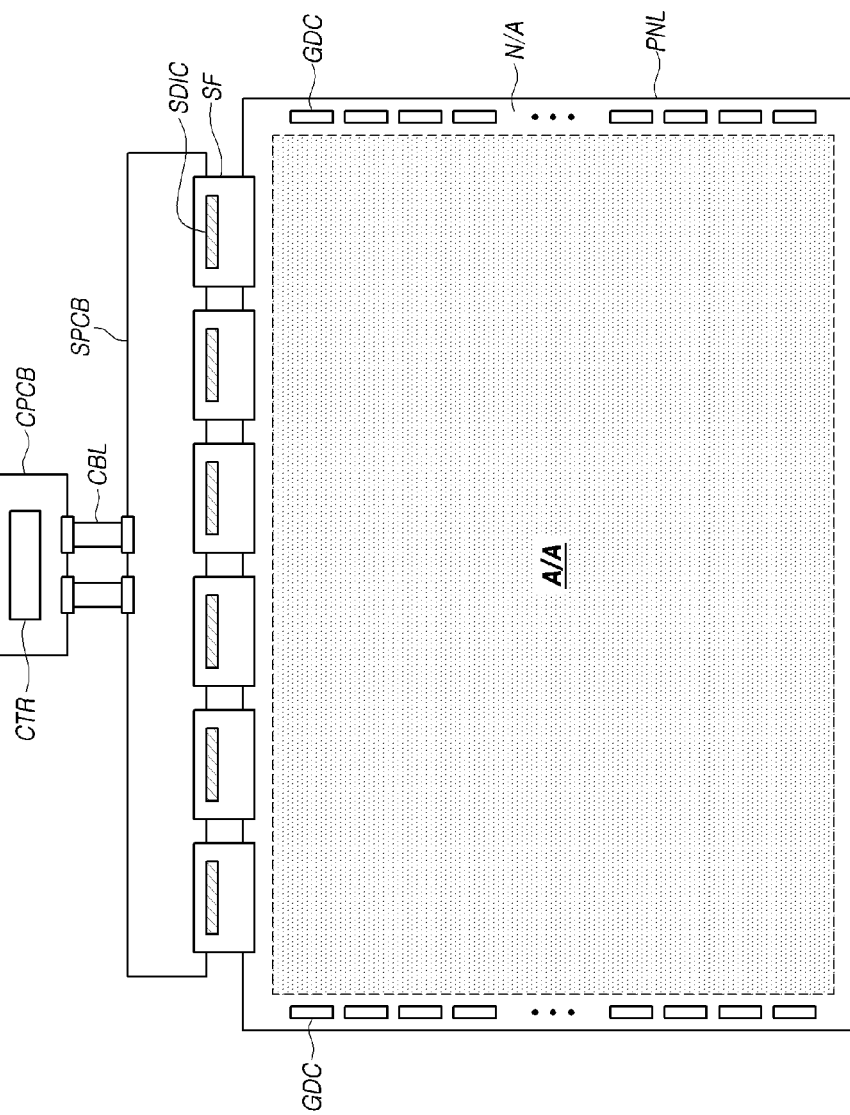
FIG. 2 illustrates an example system implementation of the display device according to one embodiment of the present disclosure.

FIG. 2 illustrates an example system implementation of the display device according to one embodiment of the present disclosure.

Referring to FIG. 2, in an electronic device according to aspects of the present disclosure, the data driver DDR may be implemented in the chip on film (COF) type of various types (TAB, COG, COF, etc.), and the gate driver GDR may be implemented in the gate in panel (GIP) type of various types (TAB, COG, COF, GIP, etc.).

The data driver DDR may be implemented as one or more source driver integrated circuits SDIC. FIG. 2 illustrates a situation in which the data driver DDR is implemented as a plurality of source driver integrated circuits SDIC.

When the data driver DDR is implemented in the COF type, each source driver integrated circuit SDIC implementing the data driver DDR may be mounted on the source-side circuit film SF.

One side of the source-side circuit film SF may be electrically connected to the pad portion (including one or more conductive pads) disposed in the non-active area N/A of the panel PNL.

Lines for electrically connecting between one or more source driver integrated circuits SDIC and the panel PNL may be disposed on the source-side circuit film SF.

The electronic device may include, for electrical connections between one or more source driver integrated circuits SDIC and other elements or devices, one or more source printed circuit boards SPCB, and a control printed circuit board CPCB for allowing control components and several types of electric elements or devices to be mounted.

The other side of the source-side circuit film SF on which the source driver integrated circuits SDIC are mounted may be connected to one or more source printed circuit boards SPCB.

That is, the one side of the source-side circuit film SF on which the source driver integrated circuits SDIC are mounted may be electrically connected to the non-active area N/A of the panel PNL, and the other side thereof may be electrically connected to one or more source printed circuit board SPCB.

The controller CTR that controls operations of the data driver DDR, the gate driver GDR, and the like may be disposed on the control printed circuit board CPCB.

A power management integrated circuit that supplies various levels of voltages or currents, or controls various levels of voltages or currents to be supplied, to the panel PNL, the data driver DDR, and the gate driver GDR etc., and the like may be further disposed on the control printed circuit board CPCB.

A circuit connection between one or more source printed circuit boards SPCB and the control printed circuit board CPCB may be performed through at least one connection member CBL. The connection member CBL may be, for example, a flexible printed circuit FPC, a flexible flat cable FFC, or the like.

One or more source printed circuit boards SPCB and the control printed circuit board CPCB may be integrated into one printed circuit board.

When the gate driver GDR is implemented in the gate-in-panel (GIP) type, one or more gate driving circuits GDC included in the gate driver GDR may be directly formed in the non-active area N/A of the panel PNL.

Each of the plurality of gate driving circuits GDC may supply a scan signal SCAN to a corresponding gate line GL disposed in the active area A/A of the panel PNL.

The plurality of gate driving circuits GDC disposed on the panel PNL can receive various signals (a clock signal, a high level gate voltage VGH, a low level gate voltage VGL, a start signal VST, a reset signal RST, and the like) which are needed for generating scan signals through gate driving-related lines disposed in the non-active area N/A.

The gate driving-related lines disposed in the non-active area N/A may be electrically connected to the source-side circuit film SF disposed closest to the plurality of gate driving circuits GDC.

Figure 3:
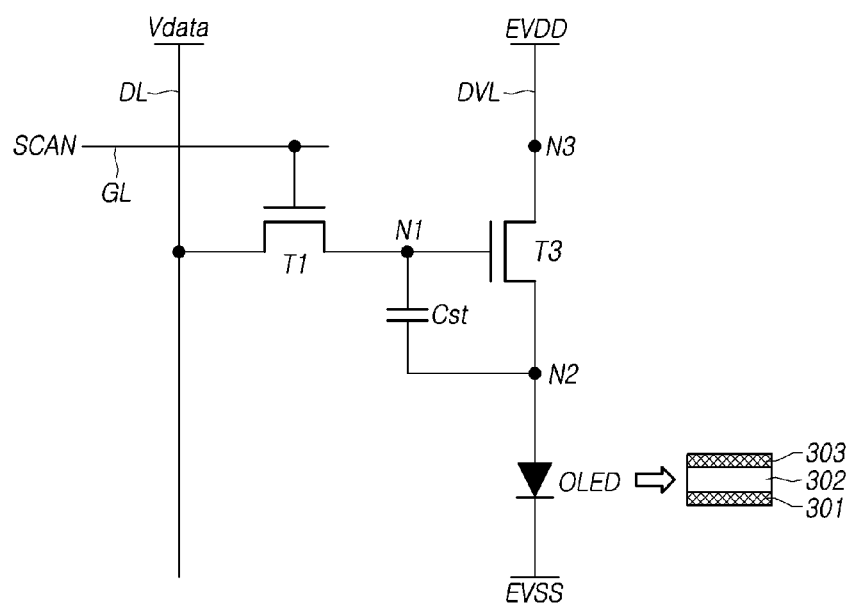
FIG. 3 illustrates a sub-pixel structure when a panel including organic light emitting diodes (OLED) are employed in the electronic device according to one embodiment of the present disclosure.

FIG. 3 illustrates a sub-pixel SP structure when an organic light emitting diode panel PNL including an organic light emitting diode (OLED) is employed in the electronic device according to one embodiment of the present disclosure.

Referring to FIG. 3, each sub-pixel SP in the organic light emitting diode panel PNL including the organic light emitting element may further include a first transistor T1 passing a data voltage Vdata to a first node N1 corresponding to a gate node of a driving transistor T3, and a storage capacitor Cst for maintaining the data voltage Vdata corresponding to an image signal voltage or a voltage corresponding to this during one frame time.

An organic light emitting element such as the organic light emitting diode (OLED) may include a first electrode 301 (anode electrode or cathode electrode), an organic layer 302 including at least one emission layer, a second electrode 303 (cathode electrode or anode electrode), and the like.

For example, a low-level voltage EVSS may be applied to the second electrode 303 of the organic light emitting diode OLED.

The driving transistor T3 can drive the organic light emitting diode OLED by supplying a driving current to the organic light emitting diode OLED.

The driving transistor T3 may have a first node N1, a second node N2, and a third node N3.

The first node N1 of the driving transistor T3 may be a node corresponding to the gate node thereof, and may be electrically connected to a source node or a drain node of the second transistor T1.

The second node N2 of the driving transistor T3 may be electrically connected to the first electrode 301 of the organic light emitting element OLED and may be a source node or a drain node.

The third node N3 of the driving transistor T3 may be the drain node or the source node as a node to which a driving voltage EVDD is applied, and may be electrically connected to a driving voltage line DVL for passing the driving voltage EVDD.

The driving transistor T3 and the first transistor T1 may be n-type transistors or p-type transistors.

The first transistor T1 may be electrically connected between a data line DL and the first node N1 of the driving transistor T3 and may be controlled by a scan signal SCAN that is carried through a gate line and applied to the gate node of the first transistor T1.

The first transistor T1 may be turned on by the scan signal SCAN and apply a data voltage Vdata passed through the data line DL to the first node N1 of the driving transistor T3.

The storage capacitor Cst may be electrically connected between the first node N1 and the second node N2 of the driving transistor T3.

The storage capacitor Cst is an external capacitor intentionally designed to be located outside of the driving transistor T3, other than an internal storage, such as a parasitic capacitor (e.g., a Cgs, a Cgd) that presents between the first node N1 and the second node N2 of the driving transistor T3.

It should be understood that the sub-pixel structure with two transistors (2T) and one capacitor (1C) shown in FIG. 3 is merely one example of possible sub-pixel structures for convenience of discussion, and embodiments of the present disclosure may be implemented in any of various structures, as desired. For example, the sub-pixel may further include at least one transistor and/or at least one capacitor. In some embodiments, each of a plurality of sub-pixels may have the same structure, or some of the plurality of sub-pixels may have a different structure.

Figure 4:
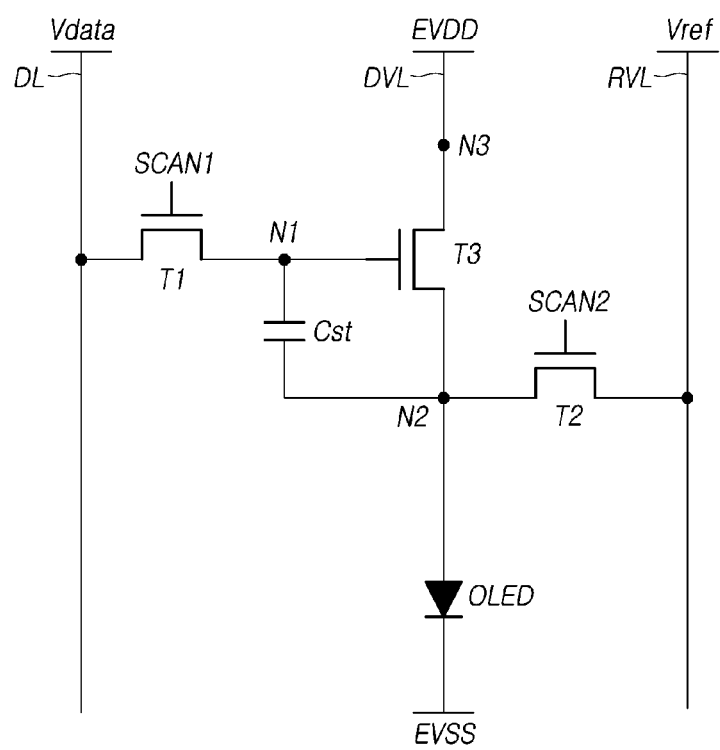
FIG. 4 illustrates a three transistor (3T) and one capacitor (1C) structure in which one sub-pixel further includes a second transistor electrically connected between a second node of a driving transistor and a reference voltage line according to one embodiment of the present disclosure.

FIG. 4 illustrates three transistors (3T) and one capacitor (1C) structure in which one sub-pixel further includes a second transistor electrically connected between the second node N2 of the driving transistor and a reference voltage line RVL according to one embodiment of the present disclosure.

Referring to FIG. 4, the second transistor T2 may be electrically connected between the second node N2 of the driving transistor T3 and the reference voltage line RVL. On-off operations of the second transistor T2 can be controlled by a second scan signal SCAN2 applied to the gate node of the second transistor T2.

A drain node or a source node of the second transistor T2 may be electrically connected to the reference voltage line RVL, and the source node or the drain node of the second transistor T2 may be electrically connected to the second node of the driving transistor T3.

The second transistor T2, for example, may be turned on in a period in which display driving is performed, and turned on in a period in which sensing driving is performed for sensing a characteristic value of the driving transistor T3 or a characteristic value of the organic light emitting diode (OLED).

The second transistor T2 may be turned on by the second scan signal SCAN2 and pass a reference voltage Vref applied to the reference voltage line RVL to the second node N2 of the driving transistor T3, according to a corresponding driving timing (e.g., a display driving timing or an initial timing within a time period for the display driving).

The second transistor T2 may be turned on by the second scan signal SCAN2 and pass a voltage at the second node N2 of the driving transistor T3 to the reference voltage line RVL, according to a corresponding driving timing (e.g., a sampling timing within the time period for the sensing driving).

In other words, the second transistor T2 can control a voltage status at the second node N2 of the driving transistor T3, or pass the voltage at the second node N2 of the driving transistor T3 to the reference voltage line RVL.

The reference voltage line RVL may be electrically connected to an analog-to-digital converter that senses a voltage of the reference voltage line RVL, converts the sensed voltage to a digital value, and then, outputs sensing data including the digital value.

The analog-to-digital converter may be included in the source driver integrated circuit SDIC implementing the data driving circuit DDR.

The sensing data output from the analog-to-digital converter may be used to sense a characteristic value of the driving transistor T3 (e.g., a threshold voltage, mobility, etc.) or a characteristic value of the organic light emitting diode (OLED) (e.g., a threshold voltage, etc.).

Meanwhile, the capacitor Cst is an external capacitor intentionally designed to be located outside of the driving transistor T3, other than an internal, such as a parasitic capacitor (e.g., a Cgs, a Cgd) that presents between the first node N1 and the second node N2 of the driving transistor T3.

Each of the driving transistor T3, the first transistor T1, and the second transistor T2 may be an n-type transistor or a p-type transistor.

Meanwhile, the first scan signal SCAN1 and the second scan signal SCAN2 may be separate gate signals. In this embodiment, the first scan signal SCAN1 and the second scan signal SCAN2 respectively may be applied to the gate node of the first transistor T1 and the gate node of the second transistor T2 through different gate lines.

In some embodiment, the first scan signal SCAN1 and the second scan signal SCAN2 may be the same gate signal. In this embodiment, the first scan signal SCAN1 and the second scan signal SCAN2 may be commonly applied to the gate node of the first transistor T1 and the gate node of the second transistor T2 through the same gate line.

It should be understood that the sub-pixel structures illustrated in FIGS. 3 and 4 are merely examples of possible sub-pixel structures for convenience of discussion, and embodiments of the present disclosure may be implemented in any of various structures, as desired. For example, the sub-pixel may further include at least one transistor and/or at least one capacitor.

In some embodiments, each of a plurality of sub-pixels may have the same structure, or some of the plurality of sub-pixels may have a different structure.

Figure 5:
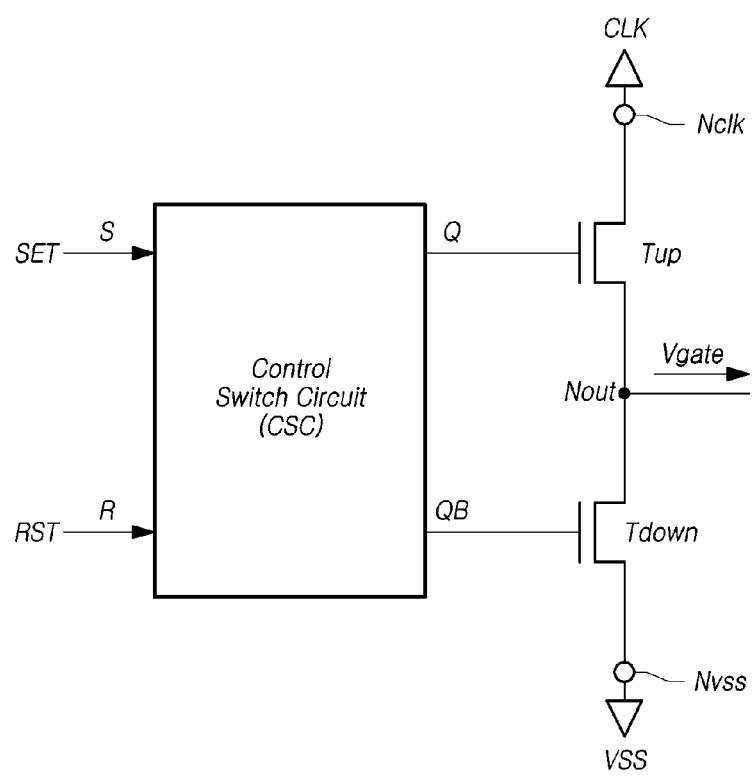
FIG. 5 illustrates a gate driving circuit GDC disposed in the panel according to one embodiment of the present disclosure.

FIG. 5 illustrates one gate driving circuit GDC disposed in the panel according to one embodiment of the present disclosure.

Referring to FIG. 5, each of the plurality of gate driving circuits GDC may include a pull-up transistor Tup, a pull-down transistor Tdown, and a control switch circuit CSC.

The control switch circuit CSC is a circuit for controlling a voltage at node Q corresponding to the gate node of the pull-up transistor Tup and a voltage at node QB corresponding to the gate node of the pull-down transistor Tdown, and may include a plurality of switches (e.g., transistors).

The pull-up transistor Tup is a transistor that supplies a gate signal Vgate corresponding to a first level voltage (e.g., a high level voltage VGH) to a gate line GL through a gate signal output node Nout. The pull-down transistor Tdown is a transistor that supplies a gate signal Vgate corresponding to a second level voltage (e.g., a low level voltage VGL) to the gate line GL through the gate signal output node Nout. The pull-up transistor Tup and the pull-down transistor Tdown may be turned on at different timings.

The pull-up transistor Tup may be electrically connected between a clock signal applying node Nclk to which a clock signal CLK is applied and the gate signal output node Nout electrically connected to the gate line GL, and can be turned on or off by the voltage at node Q.

The gate node of the pull-up transistor Tup is electrically connected to node Q. The drain node or the source node of the pull-up transistor Tup is electrically connected to the clock signal applying node Nclk. The source node or drain node of the pull-up transistor Tup is electrically connected to the gate signal output node Nout from which a gate signal Vgate is output.

The pull-up transistor Tup can be turned on by the voltage at node Q and output a gate signal Vgate having a high level voltage VGH in a high level period of the clock signal CLK to the gate signal node Nout.

The gate signal Vgate of the high level voltage VGH output to the gate signal output node Nout can be supplied to the corresponding gate line GL.

The pull-down transistor Tdown is electrically connected between the gate signal output node Nout and a base voltage node Nvss, and can be turned on or off by the voltage at node QB.

The gate node of the pull-down transistor Tdown is electrically connected to node QB. The drain node or the source node of the pull-down transistor Tdown is electrically connected to the base voltage node Nvss to receive a low-level voltage VSS corresponding to a constant voltage. The source node or drain node of the pull-down transistor Tdown is electrically connected to the gate signal output node Nout from which a gate signal Vgate is output.

The pull-down transistor Tdown can be turned on by the voltage at node QB, and output a gate signal Vgate of the low level voltage VGL to the gate signal output node Nout. Thus, the gate signal Vgate of the low level voltage VGL can be supplied to the corresponding gate line GL through the gate signal output node Nout. Here, the gate signal Vgate of the low level voltage VGL may be, for example, a low-level voltage VSS.

Meanwhile, the control switch circuit CSC may include two or more transistors, and include nodes such as node Q, node QB, a set node (S, also referred to as a start node), a reset node R, and the like. In some embodiments, the control switch circuit CSC may further include an input node to which various voltages such as a driving voltage VDD, and the like are input.

In the control switch circuit CSC, node Q is electrically connected to the gate node of the pull-up transistor Tup, and charging and discharging across node Q are repeated.

In the control switch circuit CSC, node QB is electrically connected to the gate node of the pull-down transistor Tdown, and charging and discharging across node QB are repeated.

In the control switch circuit CSC, the set node S can receive a set signal SET for instructing an initiation of gate driving of a corresponding gate driving circuit GDC.

Here, the set signal SET applied to the set node SET may be a start signal VST input from the outside of the gate driver GDR, or may be a signal (carry signal) that is fed back of a gate signal Vgate output from a gate driving circuit GDC in a stage previous to a gate driving circuit GD in the current stage.

The reset signal RST applied to the reset node R from the control switch circuit CSC may be a reset signal for simultaneously initializing gate driving circuits GDC in all stages, or may be a carry signal input from other stages (previous or subsequent stages).

The control switch circuit CSC enables charging across node Q to be performed in response to the set signal SET, and discharging across node Q to be performed in response to the reset signal RST. The control switch circuit CSC may include an inverter circuit for enable charging or discharging across each of node Q and node QB to be performed at respective different timings.

As shown in FIG. 3, the driving transistor T3 and the switching transistor T1 may be disposed in each of a plurality of sub-pixels SP in the active area A/A of the panel PNL that may be the OLED panel. However, embodiments described herein are not limited thereto. As illustrated in FIG. 4, three or more transistors may be disposed in the active area A/A of the panel PNL that may be the OLED panel.

Further, as shown in FIG. 2, when the gate driving circuit GDC is implemented in the GIP type, that is, when the gate driving circuit GDC is embedded in the panel PNL, several transistors (e.g., Tup, Tdown, and transistors in the control switch circuit CSC) included in the gate driving circuit GDC as shown in FIG. 5 may be disposed in the non-active region N/A that is an edge area of the active region A/A of the panel PNL.

Figure 6:
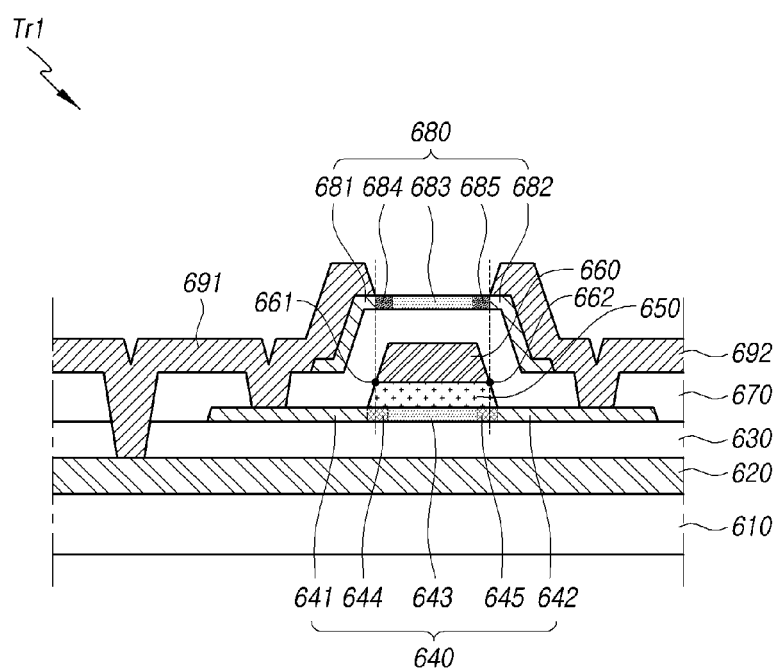
FIG. 6 is a cross-sectional view illustrating a structure of a thin film transistor disposed in the electronic device according to one embodiment of the present disclosure.
Figure 7A:
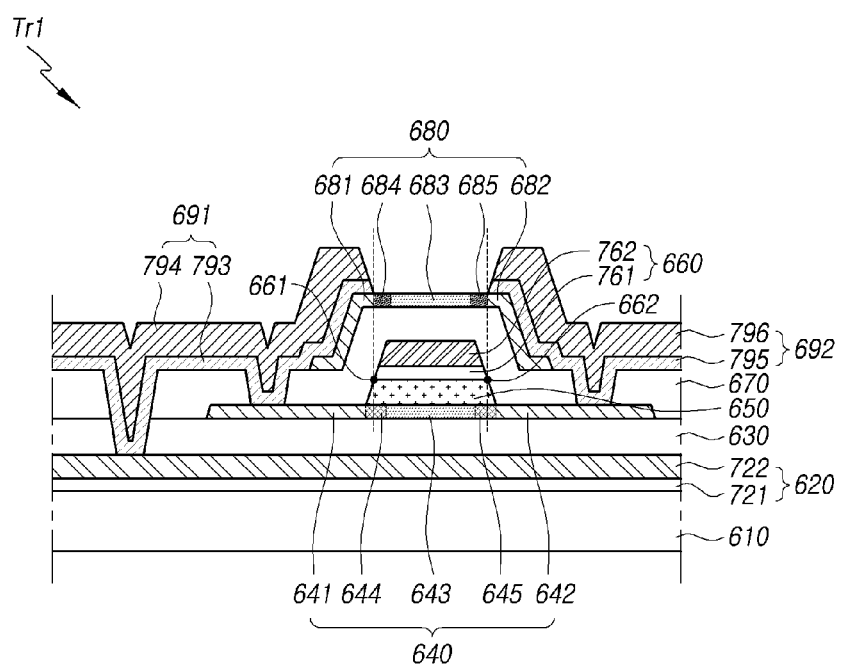
FIGS. 7A and 7B illustrate other thin film transistor structures in the electronic device according to one embodiment of the present disclosure.
Figure 7B:
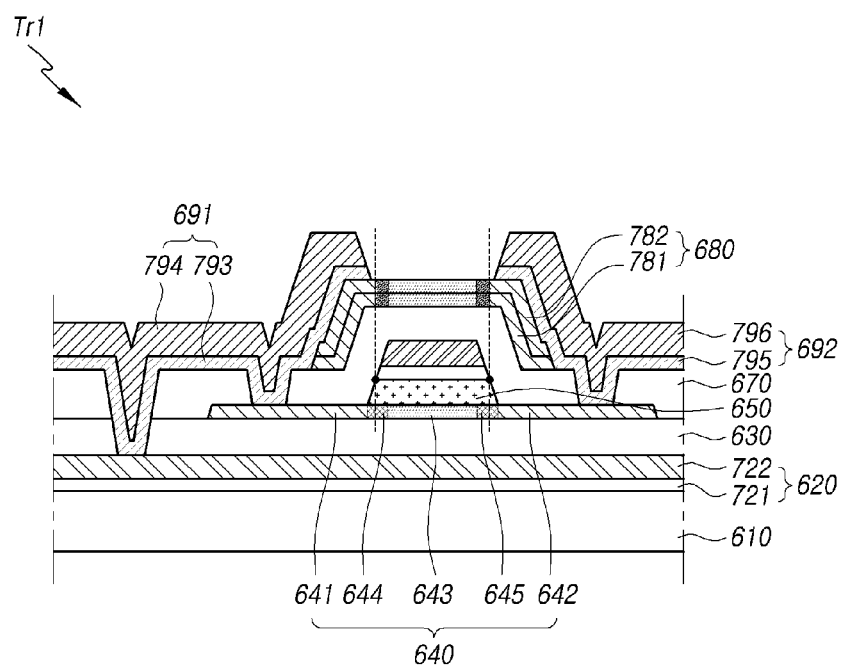
Figure 8:
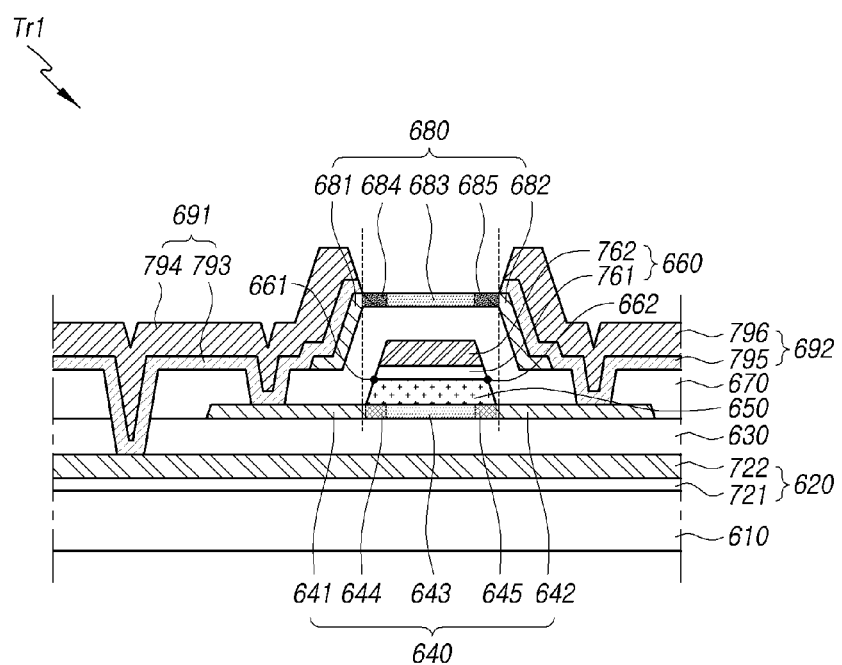
FIG. 8 illustrates further another thin film transistor structure in the electronic device according to one embodiment of the present disclosure.

FIG. 6 is a cross-sectional view illustrating a structure of a thin film transistor disposed in the electronic device according to one embodiment of the present disclosure. FIGS. 7A and 7B are cross-sectional views illustrating structures of other thin film transistors disposed in the electronic device according to one embodiment of the present disclosure. FIG. 8 is a cross-sectional view illustrating a structure of further another thin film transistor disposed in the electronic device according to one embodiment of the present disclosure.

A plurality of thin film transistors may be disposed in the electronic device according to aspects of the present disclosure, and may be at least one of the thin film transistors shown in FIGS. 6, 7A, 7B, and 8.

Referring to FIGS. 6 to 8, at least one first thin film transistor Tr1 may be disposed in the electronic device according to aspects of the present disclosure.

The first thin film transistor Tr1 may include a first active layer 640, a first gate electrode 660, a second active layer 680, a first electrode 691 and a second electrode 692.

Specifically, a light blocking layer 620 may be disposed on a substrate 610.

The light blocking layer 620 may be disposed under a first active layer 640 and may serve to protect the first active layer 640 from external factors (e.g., light).

The light blocking layer 620 may include any one of either a metal such as aluminum (Al), gold (Au), silver (Ag), copper (Cu), tungsten (W), molybdenum (Mo), chromium (Cr), tantalum (Ta), titanium (Ti), or the like, or an alloy thereof; however, embodiments of the present disclosure are not limited thereto.

In an embodiment, as illustrated in FIG. 6, the light blocking layer 620 may have a single layer structure.

In some embodiments, as illustrated in FIGS. 7A, 7B, and 8, the light blocking layer 620 may have a multilayer structure including a first light blocking layer 721 disposed on the substrate 610 and a second light blocking layer 722 disposed on the first light blocking layer 721.

In an embodiment, the first light blocking layer 721 and the second light blocking layer 722 may include different materials. However, embodiments of the present disclosure are not limited thereto.

Although FIGS. 6 to 8 illustrate structures in which the light blocking layer 620 is disposed under the first active layer 640, in some embodiments, the light blocking layer 620 may not be disposed under the first active layer 640.

As such, although other structures are available, for convenience of description, in the following description, discussions will be conducted by focusing on such a structure in which the light blocking layer 620 is disposed under the first active layer 640.

A buffer layer 630 may be disposed on the light blocking layer 620.

The buffer layer 630 may include an inorganic insulating material such as silicon oxide (SiOx), silicon nitride (SiNx), or silicon oxynitride (SiON). However, embodiments of the present disclosure are not limited thereto.

Although FIGS. 6 to 8 illustrate that the buffer layer 630 has a single layer structure; however, embodiments of the present disclosure are not limited thereto. For example, the buffer layer 630 may have a multilayer structure.

When the buffer layer 630 has the multilayer structure, the buffer layer 630 may have a structure alternatively stacked by at least two of inorganic insulating materials such as silicon oxide (SiOx), silicon nitride (SiNx), silicon oxynitride (SiON), or the like; however, embodiments of the present disclosure are not limited thereto.

In the following description, for convenience of description, discussions will be conducted by focusing on such a structure in which the buffer layer 630 has a single layer.

The first active layer 640 may be disposed on the buffer layer 630.

The first active layer 640 may be one or more of various types of semiconductor layers.

The first active layer 640 may include an oxide semiconductor. A material included in the first active layer 640 may be a metal oxide semiconductor, and may be formed of i) an oxide of a metal such as molybdenum (Mo), zinc (Zn), indium (In), gallium (Ga), tin (Sn), titanium (Ti), or the like, or ii) an combination of a metal such as molybdenum (Mo), zinc (Zn), indium (In), gallium (Ga), tin (Sn), titanium (Ti), or the like and an oxide of molybdenum (Mo), zinc (Zn), indium (In), gallium (Ga), tin (Sn), titanium (Ti), or the like.

For example, the first active layer 640 may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO). However, embodiments of the present disclosure are not limited thereto.

The first active layer 640 may include a first region 641, a second region 642, and a first channel region 643. The first region 641 may be a source region of the first active layer 640, and the second region 642 may be a drain region of the first active layer 640. However, embodiments of the present disclosure are not limited thereto. For example, the first region 641 may be the drain region of the first active layer 640, and the second region 642 may be the source region of the first active layer 640.

The first region 641 and the second region 642 of the first active layer 640 may be spaced apart from each other, and the first channel region 643 may be disposed between the first region 641 and the second region 642.

In another embodiment, the first active layer 640 may include a first region 641, a second region 642, a first channel region 643, a first auxiliary region 644 and a second auxiliary region 645.

The first auxiliary region 644 may be disposed between the first region 641 and the first channel region 643, and the second auxiliary region 645 may be disposed between the second region 642 and the first channel region 643.

The electrical resistance (an electrical resistance value) of each of the first auxiliary region 644 and the second auxiliary region 645 may be greater than the electrical resistance (an electrical resistance value) of each of the first region 641 and the electrical resistance of the second region 642, and less than the electrical resistance (an electrical resistance value) of the first channel region 643.

The first region 641, the second region 642, and the first channel region 643 may be included, or the first region 641, the second region 642, the first channel region 643, the first auxiliary region 644 and the second auxiliary region 645 may be included, depending on the electrical resistance of each region of the first active layer 640.

A first gate insulating film 650 may be disposed on the first active layer 640.

The first gate insulating film 650 may overlap at least a part of the first active layer 640.

Specifically, the first gate insulating film 650 may overlap the first channel region 643 of the first active layer 640.

In some embodiments, the first gate insulating film 650 may overlap the first auxiliary region 644 and the second auxiliary region 645 of the first active layer 640.

As the first gate insulating film 650 is formed by patterning a material of the first gate insulating film 650 through a dry etching process, as a result, the first gate insulating film 650 may be disposed on the first channel region 643, the first auxiliary region 644, and the second auxiliary region 645 of the first active layer 640.

The first region 641 and the second region 642 located in one or more regions corresponding to one or more regions in which one or more parts of the material of the first gate insulating film 650 are removed by the patterning in the dry etching process may become modified to act as a conductor. Hereinafter, a situation in which a material becomes modified to act as a conductor is referred to as "conductorized", or a term similar to this. In other words, the first region 641 and the second region 642 may be regions in which carriers are easily movable.

In addition, in the process of performing the dry etching for the material of the first gate insulating film 650, one or more parts of the first active layer 640 corresponding to one or more edges of the first gate insulating film 650 may also become conductorized. The one or more parts of the first active layer 640 that correspond to the one or more edges of the first gate insulating film 650 and become conductorized may be the first auxiliary region 644 and the second auxiliary region 645. Thus, carriers are easily movable in the first auxiliary region 644 and the second auxiliary region 645.

However, since the first auxiliary region 644 and the second auxiliary region 645 are formed in regions corresponding to edges of the first gate insulating film 650, and the edges of the first gate insulating film 650 serve as a mask, therefore, the first auxiliary region 644 and the second auxiliary region 645 may become conductorized at a level lower than that of the first region 641 and the second region 642.

In other words, the electrical resistance of each of the first auxiliary region 644 and the second auxiliary region 645 may be higher than that of each of the first region 641 and the second region 642.

A first gate electrode 660 may be disposed on the first gate insulating film 650.

The first gate electrode 660 may include any one of a metal such as aluminum (Al), gold (Au), silver (Ag), copper (Cu), tungsten (W), molybdenum (Mo), chromium (Cr), tantalum (Ta), titanium (Ti), or the like, or an alloy thereof; however, embodiments of the present disclosure are not limited thereto.

In an embodiment, as illustrated in FIG. 6, the first gate electrode 660 may have a single layer structure.

In some embodiments, as illustrated in FIGS. 7A, 7B, and 8, the first gate electrode 660 may have a multilayer structure including a first sub-gate electrode 761 disposed on the first gate insulating film 650 and a second sub-gate electrode 762 disposed on the first sub-gate electrode 661.

In an embodiment, the first sub-gate electrode 761 and the second sub-gate electrode 762 may include different materials. However, embodiments of the present disclosure are not limited thereto.

In some embodiments, the first gate electrode 660 may be selectively applied in a single layer or multilayer structure.

The first gate electrode 660 may overlap the first channel region 643 of the first active layer 640.

In some embodiments, the first gate electrode 660 may overlap all or a part of each of the first auxiliary region 644 and the second auxiliary region 645 of the first active layer 640.

A length of the first channel region 643 of the first active layer 640 may be equal to or shorter than a length of the first gate electrode 660. Here, the length of the first channel region 643 and the length of the first gate electrode 660 are based on a direction perpendicular to a direction in which the first gate insulating film 650 is stacked on the first active layer 640.

When the length of the first channel region 643 is the same as the length of the first gate electrode 660, the first active layer 640 may include the first region 641, the second region 642, and the first channel region 643.

When the length of the first channel region 643 is shorter than the length of the first gate electrode 660, the first active layer 640 may include the first region 641, the second region 642, the first channel region 643, the first auxiliary region 644, and the second auxiliary region 645.

In the following description, for convenience of description, discussion will be conducted by focusing on the structure in which the first active layer 640 includes the first region 641, the second region 642, the first channel region 643, the first auxiliary region 644, and the second auxiliary region 645.

A second gate insulating film 670 may be disposed on the first gate electrode 660.

The second gate insulating film 670 may include an inorganic insulating material such as silicon oxide (SiOx), silicon nitride (SiNx), or silicon oxynitride (SiON). However, embodiments of the present disclosure are not limited thereto.

A second active layer 680 may be disposed on the second gate insulating film 670. The second active layer 680 may overlap the first gate electrode 660.

The second active layer 680 may be one or more of various types of semiconductor layers.

The second active layer 680 may include an oxide semiconductor. An material included in the second active layer 680 may be a metal oxide semiconductor, and may be formed of i) an oxide of a metal such as molybdenum (Mo), zinc (Zn), indium (In), gallium (Ga), tin (Sn), titanium (Ti), or the like, or ii) an combination of a metal such as molybdenum (Mo), zinc (Zn), indium (In), gallium (Ga), tin (Sn), titanium (Ti), or the like and an oxide of molybdenum (Mo), zinc (Zn), indium (In), gallium (Ga), tin (Sn), titanium (Ti), or the like.

For example, the second active layer 680 may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO); however, embodiments of the present disclosure are not limited thereto.

In an embodiment, as illustrated in FIG. 7A, the second active layer 680 may have a single layer structure.

In another embodiment, as illustrated in FIG. 7B, the second active layer 680 may have a multilayer structure. For example, the second active layer 680 may include a first oxide active layer 781 disposed on the second gate insulating film 670 and a second oxide active layer 782 disposed on the first oxide active layer 781.

For convenience of description, in the following description, discussions will be conducted by focusing on the second active layer 680 having a single layer structure.

The second active layer 680 may include a third region 681, a fourth region 682, and a second channel region 683. The third region 681 may be a source region of the second active layer 680, and the second region 682 may be a drain region of the second active layer 680. However, embodiments of the present disclosure are not limited thereto. For example, the first region 681 may be the drain region of the second active layer 680, and the second region 682 may be the source region of the second active layer 680.

The third region 681 and the fourth region 682 of the second active layer 680 may be spaced apart from each other, and the second channel region 683 may be disposed between the third region 681 and the fourth region 682.

In another embodiment, the second active layer 680 may include a third region 681, a fourth region 682, a second channel region 683, a third auxiliary region 684 and a fourth auxiliary region 685.

The third auxiliary region 684 may be disposed between the third region 681 and the second channel region 683, and the fourth auxiliary region 685 may be disposed between the fourth region 682 and the second channel region 683.

The electrical resistance of each of the third auxiliary region 684 and the fourth auxiliary region 685 may be greater than the electrical resistance of the third region 681 and the electrical resistance of the fourth region 682, and less than the electrical resistance of the second channel region 683.

The third region 681, the fourth region 682, and the second channel region 683 may be included, or the third region 681, the fourth region 682, the second channel region 683, the third auxiliary region 684 and the fourth auxiliary region 685 may be included, depending on the electrical resistance of each region of the second active layer 680.

A length of the second channel region 683 of the second active layer 680 may be equal to or less than a length of the first gate electrode 660. Here, the length of the second channel region 683 and the length of the first gate electrode 660 are based on a direction perpendicular to a direction in which the first gate insulating film 650 is stacked on the first active layer 640.

When the length of the second channel region 683 is the same as the length of the first gate electrode 660, the second active layer 680 may include the third region 681, the fourth region 682, and the second channel region 683.

When the length of the second channel region 683 is less than the length of the first gate electrode 660, the second active layer 680 may include the third region 681, the fourth region 682, the second channel region 683, the third auxiliary region 684, and the fourth auxiliary region 685.

In the following description, for convenience of description, discussion will be conducted by focusing on the structure in which the second active layer 680 includes the third region 681, the fourth region 682, the second channel region 683, the third auxiliary region 684, and the fourth auxiliary region 685.

As shown in FIG. 7B, when the second active layer 680 has a double layer structure, the second oxide active layer 782 may include regions corresponding to the third region 681, the fourth region 682, the second channel region 683, the third auxiliary region 684, and the fourth auxiliary region 685 in FIG. 7A. Further, the first oxide active layer 781 may also include regions corresponding to the third region 681, the fourth region 682, the second channel region 683, the third auxiliary area 684, and the fourth auxiliary area 685 in FIG. 7A.

Referring to FIGS. 6 to 8, a first electrode 691 and a second electrode 692 may be disposed on the second active layer 680 and the second gate insulating film 670.

The first electrode 691 and the second electrode 692 may be disposed to be spaced apart from each other.

The first electrode 691 may contact all of an upper surface, and all of one side surface (a side surface farther spaced apart from the third auxiliary region 684 of side surfaces of the third region 681) of the third region 681 of the second active layer 680.

The second electrode 692 may contact all of an upper surface, and all of one side surface (a side surface farther spaced apart from the fourth auxiliary region 685 of side surfaces of the fourth region 682), of the fourth region 682 of the second active layer 680.

In an embodiment, as illustrated in FIG. 6, the first electrode 691 and the second electrode 692 may have a single layer structure.

Each of the first electrode 691 and the second electrode 692 may include titanium (Ti) or an alloy including titanium (Ti). In an embodiment, each of the first electrode 691 and the second electrode 692 may be a molybdenum titanium (MoTi) alloy; however, embodiments of the present disclosure are not limited thereto.

In some embodiments, as illustrated in FIGS. 7A, 7B, and 8, the first electrode 691 and the second electrode 692 may a multilayer structure. In an embodiment, the first electrode 691 may include a first conductive layer 793 disposed on the second active layer 680 and the second gate insulating film 670, and a second conductive layer 794 disposed on the first conductive layer 793. In an embodiment, the second electrode 692 may include a third conductive layer 795 disposed on the second active layer 680 and the second gate insulating film 670, and a fourth conductive layer 796 disposed on the third conductive layer 795.

The first conductive layer 793 of the first electrode 691 may contact all of an upper surface, and all of one side surface (a side surface farther spaced apart from the third auxiliary region 684 of side surfaces of the third region 681), of the third region 681 of the second active layer 680.

The third conductive layer 795 of the second electrode 692 may contact all of an upper surface, and all of one side surface (a side surface farther spaced apart from the fourth auxiliary region 685 of side surfaces of the fourth region 682) of the fourth region 682 of the second active layer 680.

Each of the first conductive layer 793 of the first electrode 691 and the third conductive layer 795 of the second electrode 692 may include titanium (Ti) or an alloy including titanium (Ti). In an embodiment, each of the first conductive layer 793 and the third conductive layer 795 may be a molybdenum titanium (MoTi) alloy. However, embodiments of the present disclosure are not limited thereto.

The second conductive layer 794 of the first electrode 691 and the fourth conductive layer 796 of the second electrode 692 may include any one of a metal such as aluminum (Al), gold (Au), silver (Ag), copper (Cu), tungsten (W), molybdenum (Mo), chromium (Cr), tantalum (Ta), titanium (Ti), or the like, or an alloy thereof; however, embodiments of the present disclosure are not limited thereto.

In other words, a region of the first electrode 691 contacting the third region 681 of the second active layer 680 and a region of the second electrode contacting the fourth region 682 of the second active layer 680 may include titanium (Ti) or an alloy including titanium (Ti), for example, a molybdenum titanium (MoTi) alloy.

A metal (for example, titanium (Ti) or molybdenum titanium (MoTi)) having a low bond energy or binding energy or low formation energy $E_{formation}$ may contact a partial region of the second active layer 680 that is an oxide semiconductor, and serve to take away oxygen from the second active layer 680.

For example, when the second active layer 680 is formed of amorphous indium-gallium-zinc oxide (IGZO), while bonding force between indium, gallium, and zinc, which are metallic materials, is strong, oxygen, which is a non-metallic material, is bound to indium, gallium and zinc with relatively weak bonding force.

When molybdenum titanium (MoTi) having low binding energy or low formation energy contacts the second active layer 680, oxygen of the second active layer 680 bonded with a weak bonding force is sucked, resulting in a region in which oxygen vacancies occur being present in the second active layer 680.

The oxygen concentration of the third region 681 contacting the first electrode 691 may be lower than those of other regions of the second active layer 680 (e.g., the second channel region 683, the third auxiliary region and the fourth auxiliary region) which do not contact the first electrode 691, and the oxygen concentration of the fourth region 682 contacting the second electrode 692 may be lower than that those of other regions of the second active layer 680 which do not contact the second electrode 692.

In other words, as oxygen vacancies serving as a positive charge are present in the third region 681 and the fourth region 682 of the second active layer 680 contacting the first electrode 691 and the second electrode 692, and the third region 681 and the fourth region 682 generate electrons to maintain electrical neutrality, and the generated electrons become carriers, the electrical conductivity of the third region 681 and the fourth region 682 can therefore increase.

That is, the third region 681 and the fourth region 682 of the second active layer 680 of FIGS. 6 to 8 may be in a conductorized state due to the presence of oxygen vacancies.

The second channel region 683 of the second active layer 680 may have little or no oxygen vacancy, and the third region 681 and the fourth region 682 may be in a state that contains many oxygen vacancies compared with the second channel region 683.

As described above, since oxygen vacancies may generate carriers, a concentration gradient of carriers may occur between the third and fourth regions 681 and 682 and the second channel region 683.

Accordingly, carrier diffusion may occur from each of the third region 681 and the fourth region 682 having a high carrier concentration toward the second channel region 683.

A region in which carriers diffuse from the third region 681 toward the second channel region 683 may become the third auxiliary region 684, and a region in which carriers diffuse from the fourth region 682 toward the second channel region 683 may become the fourth auxiliary region 685.

The third auxiliary region 684 and the fourth auxiliary region 685 are regions in which carriers (or oxygen vacancies) diffused from the third region 681 or the fourth region 682 are present, and thus, the amount (e.g., number) of carriers present in the third auxiliary region 684 and the fourth auxiliary region 685 may be less than the amount of carriers present in the third region 681 and the fourth region 682. Further, since there are almost no carriers in the second channel region 683, the amount of carriers present in the third auxiliary region 684 and the fourth auxiliary region 685 is greater than the amount of carriers in the second channel region 683.

Accordingly, the electrical resistance of each of the third auxiliary region 684 and the fourth auxiliary region 685 may be less than that of the second channel region 683, and be higher than that of each of the third region 681 and the fourth region 682.

In this manner, as the first electrode 691 contacts the third region 681 of the second active layer 680, and the second electrode 692 contacts the fourth region 682 of the second active layer 680, the third region 681 and the fourth region 682 of the second active layer 680 according to embodiments described herein may become conductorized without a separate process.

The third region 681 may be a region contacting the first electrode 691, and not overlap one end of the third auxiliary region 684 extending from the third region 681. The other end of the third auxiliary region 684 may overlap the first gate electrode 660.

Here, the one end of the first electrode 691 may be aligned with one end 661 of the first gate electrode 660. When the first gate electrode 660 has a tapered shape relative to the substrate as illustrated in FIGS. 6, 7A, and 7B, the one end 661 of the first gate electrode 660 may be one of both outer edges of a portion of the first gate electrode 660 having the longest width in a plan view.

Further, the fourth region 682 may be a region contacting the second electrode 692, and not overlap one end of the fourth auxiliary region 685 extending from the fourth region 682. The other end of the fourth auxiliary region 685 may overlap the first gate electrode 660.

Here, the one end of the second electrode 692 may be aligned with the other end 662 of the first gate electrode 660. When the first gate electrode 660 has a tapered shape relative to the substrate as illustrated in FIGS. 6, 7A, and 7B, the other end 662 of the first gate electrode 660 may be the other of both outer edges of the portion of the first gate electrode 660 having the longest width in a plan view.

However, embodiments of the present disclosure are not limited thereto. For example, as shown in FIG. 8, one end of the first electrode 691 may not overlap one end 661 of the first gate electrode 660, and one end of the second electrode 692 may not overlap the other end 662 of the first gate electrode 660.

Specifically, each of the first electrode 691 and the second electrode 692 may not overlap the first gate electrode 660.

In this situation, the third region 681 and the fourth region 682 of the second active layer 680 may not overlap the first gate electrode 660. However, as the third auxiliary region 684 is disposed between the third region 681 and the second channel region 683, and a fourth auxiliary region 685 is disposed between the fourth region 682 and the second channel region 683, when a voltage is applied to the first gate electrode 660, current can flow through the second active layer 680.

The lengths of the third region 681 and the fourth region 682 of the second active layer 680 of FIGS. 6, 7A, and 7B may be greater than the lengths of the third region 681 and the fourth region 682 of the second active layer 680 of FIG. 8, respectively.

Further, as the third region 681 and the fourth region 682 of the second active layer 680 of FIG. 8 have lengths less than the third region 681 and the fourth region 682 of the second active layer 680 of FIGS. 6, 7A, and 7B, respectively, the length of the second channel region 683 of the second active layer 680 of FIG. 8 may become greater than the length of the second channel region 683 of the second active layer 680 of FIGS. 6, 7A, and 7B.

In other words, the length of the second channel region 683 of the second active layer 680 may be determined depending on the locations of the first electrode 691 and the second electrode 692.

As illustrated in FIGS. 6 to 8, the first electrode 691 may be electrically connected to the first region 641 of the first active layer 640 through a contact hole formed in the second gate insulating film 670.

The first electrode 691 may be electrically connected to the light blocking layer 620 through one or more other contact holes formed in the buffer layer 630 and the second gate insulating film 670. The light blocking layer 620 may have a configuration corresponding to a data line. However, embodiments of present disclosure are not limited thereto.

The second electrode 692 may be electrically connected to the second region 642 of the first active layer 640 through another contact hole formed in the second gate insulating film 670.

In other words, the first electrode 691 may be electrically connected to the first region 641 of the first active layer 640 and the third region 681 of the second active layer 680, and the second electrode 692 may be electrically connected to the second region 642 of the first active layer 640 and the fourth region 682 of the second active layer 680.

When a voltage is applied to the first gate electrode 660, current can flow through both the first active layer 640 and the second active layer 680.

That is, as illustrated in FIGS. 6 to 8, the first thin film transistor Tr1 according to the embodiments described herein can drive two active layers 640 and 680 through one first gate electrode 660.

As a channel length of the active layer of the first thin film transistor Tr1 may be the sum of the length of the first channel region 643 and the length of the second channel region 683, the length of the channel region can be increased when compared with a structure in which the thin film transistor includes only one active layer, as a result, a large amount of current can be instantaneously passed through the active layers 640 and 680 of the first thin film transistor Tr1.

Thus, the first thin film transistor Tr1 of FIGS. 6 to 8 can be applied to panels having high current driving capability and high resolution. For example, the first thin film transistor Tr1 may be used as the driving transistors shown in FIGS. 3 and 4.

Further, in the first thin film transistor Tr1, as the first gate electrode 660 is disposed on the first active layer 640, and the second active layer 680 is disposed on the first gate electrode 660, so that the first gate electrode 660 and the second active layer 680 can overlap each other. By having an overlapping stacked structure, it is therefore possible to provide an effect of improving the current driving capability without increasing the size of the thin film transistor in order to increase a channel length of the active layer.

Further, a plurality of thin film transistors may be disposed in the gate driving circuit GDC disposed in the non-active region N/A of the panel, and at least some (e.g., the pull-up transistor or pull-down transistor of FIG. 5 that supplies a gate signal) of the thin film transistors included in the gate driving circuit GDC are needed to have a function capable of instantaneously passing a large amount of current. To do this, in some attempts, although the required amount of current can be satisfied by designing the thin film transistor to have a large size, however, in this case, a size of a non-active region N/A of a panel becomes increased, and as a result, there occurs a problem that a narrow bezel cannot be realized.

When any of the first thin film transistors Tr1 illustrated in FIGS. 6 to 8 are used as the pull-up transistor or pull-down transistor of FIG. 5 in the gate driving circuit GDC, such transistors are able to generate a high current in a small area without increasing the size of the thin film transistor, and in turn, there is provided an effect of realizing a narrow bezel.

Figure 9:
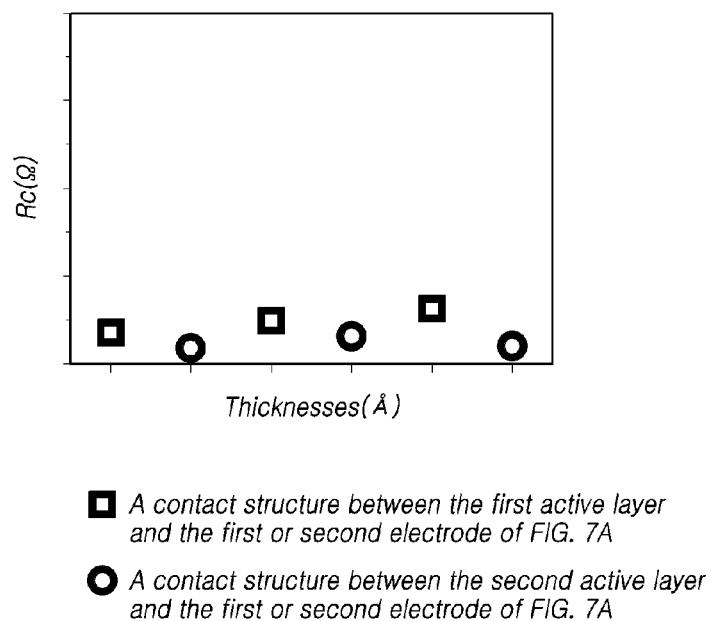
FIG. 9 is a plot illustrating contact resistances between active layers and a first or second electrode of a thin film transistor according to one embodiment of the present disclosure.

Next, referring to FIG. 9, discussions are conducted on contact resistances between the active layers and the first or second electrode of the thin film transistor according to embodiments described herein.

FIG. 9 is a plot illustrating contact resistances between the active layers and the first or second electrode of the thin film transistor according to one embodiment of the present disclosure.

In FIG. 9, an X-axis represents thicknesses of the active layers of FIG. 7A, and a Y-axis represents contact resistances between the conductorized regions of the active layers and the first or second electrode in FIG. 7A. In FIG. 9, a square shape represents to an embodiment of a contact structure between the first active layer and the first or second electrode of FIG. 7A, and a circular shape represents to an embodiment of a contact structure between the second active layer and the first or second electrode of FIG. 7A.

Referring to FIG. 9, even when the thicknesses of the first active layer and the second active layer are changed, a contact resistance between the conductorized region of the first active layer and the first electrode (or second electrode) may be the same as or similar to a contact resistance between the conductorized region of the second active layer and the first electrode (or second electrode).

Specifically, the first region 641 and the second region 642 of the first active layer 640 of FIG. 7A may become conductorized through a dry etching process of the first gate insulating film 650, and a part of the first region 641 may contact the first electrode 691 through a contact hole, and a part of the second region 642 may contact the second electrode 692 through a contact hole.

The third region 681 of the second active layer 680 of FIG. 7A may become conductorized only by an arrangement of contacting the first electrode 691, and the fourth region 682 of the second active layer 680 may become conductorized only by an arrangement of contacting the second electrode 692.

That is, the first and second regions 641 and 642 of the first active layer 640 and the third and fourth regions 681 and 682 of the second active layer 680 may become conductorized in different principles.

However, as shown in FIG. 9, even when the first and second regions 641 and 642 of the first active layer 640 and the third and fourth regions 681 and 682 of the second active layer 680 become conductorized differently, it can be seen that differences between contact resistance values between the conductorized regions (first to fourth regions) of the first and second active layers 640 and 680 and the first or second electrode are within a margin of error, that is, similar to one another.

In other words, even when the third and fourth regions 681 and 682 of the second active layer 680 directly contact the first and second electrodes 691 and 692 including a metal such as titanium (Ti) or a titanium (Ti) alloy, it can be seen that a phenomenon that the contact resistance adversely affects a current flowing through the second active layer 680 does not occur substantially.

Figure 10:
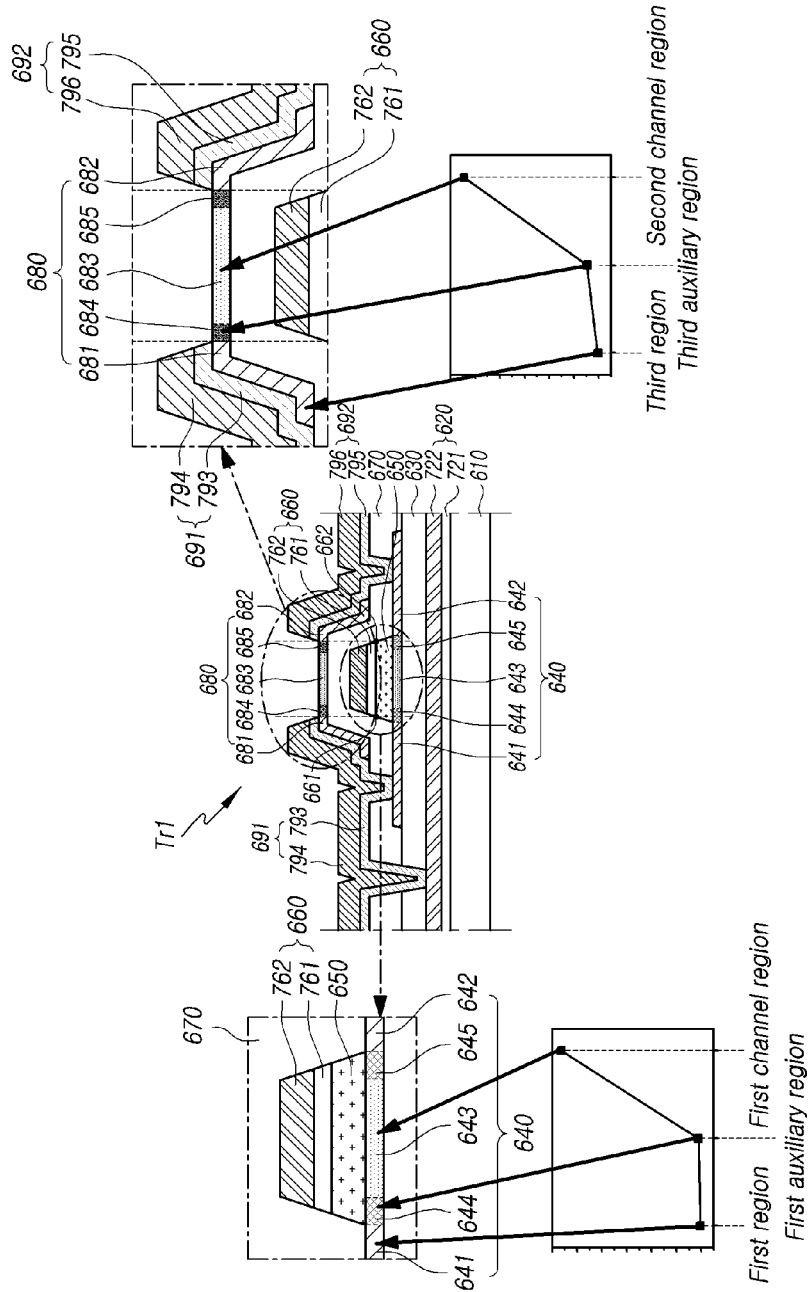
FIG. 10 is a diagram for illustrating an electrical resistance in a first active layer and an electrical resistance in a second active layer in a first thin film transistor of FIG. 7A according to one embodiment of the present disclosure.

Next, referring to FIG. 10, discussions are conducted on a relationship between respective electrical resistances in the first active layer and the second active layer.

FIG. 10 is a diagram for illustrating an electrical resistance in the first active layer and an electrical resistance in the second active layer in the first thin film transistor of FIG. 7A.

In the graphs included in FIG. 10, the X-axis represents the regions of each active layer, and the Y-axis represents the magnitude of the resistance.

Referring to FIG. 10, the first active layer 640 may include the first region 641, the second region 642, the first channel region 643, the first auxiliary region 644, and the second auxiliary region 645.

The first region 641 of the first active layer 640 may be a conductorized region and have an electric resistance less than that of each of the first auxiliary region 644 and the first channel region 643. The first auxiliary region 644 is a region in which carriers are diffused from the first region 641, and may have an electrical resistance higher than the first region 641, but have an electrical resistance significantly lower than the first channel region 643.

Meanwhile, respective electrical resistances of the first region 641 and the second region 642 of the first active layer 640 may be the same as or similar to each other. Respective electrical resistances of the first auxiliary region 644 and the second auxiliary region 645 of the first active layer 640 may be the same as or similar to each other.

For convenience of explanation, although discussions have not conducted on the characteristics of electrical resistances of the second region 642 and the second auxiliary region 645 of the first active layer 640, the characteristic of the electrical resistance of the second region 642 of the first active layer 640 may be substantially the same as the characteristic of the electrical resistance of the first region 641 of the first active layer 640. Further, the characteristic of the electrical resistance of the second auxiliary region 645 of the first active layer 640 may be substantially the same as the characteristic of the electrical resistance of the first auxiliary region 644 of the first active layer 640.

The second active layer 680 may include the third area 681, the fourth area 682, the second channel area 683, the third auxiliary area 684, and the fourth auxiliary area 685.

The third region 681 of the second active layer 680 may be a conductorized region and have an electric resistance lower than that of each of the third auxiliary region 684 and the second channel region 683. The third auxiliary region 684 is a region in which carriers are diffused from the third region 681, and may have an electrical resistance higher than the third region 681, but have an electrical resistance significantly lower than the second channel region 683.

Meanwhile, respective electrical resistances of the third region 681 and the fourth region 682 of the second active layer 680 may be the same as or similar to each other. Respective electrical resistances of the third auxiliary region 684 and the fourth auxiliary region 685 of the second active layer 680 may be the same as or similar to each other.

For convenience of explanation, although discussions have not conducted on the characteristics of electrical resistances of the fourth region 682 and the fourth auxiliary region 685 of the second active layer 680, the characteristic of the electrical resistance of the fourth region 682 of the second active layer 680 may be substantially the same as the characteristic of the electrical resistance of the third region 681 of the second active layer 680. Further, the characteristic of the electrical resistance of the fourth auxiliary region 685 of the second active layer 680 may be substantially the same as the characteristic of the electrical resistance of the third auxiliary region 684 of the second active layer 680.

As illustrated in FIG. to 10, an electric resistance value of the first region 641 of the first active layer 640 and an electric resistance value of the third region 681 of the second active layer 680 may be the same as or similar to each other. Further, an electric resistance value of the first channel region 643 of the first active layer 640 and an electric resistance value of the second channel region 683 of the second active layer 680 may be the same as or similar to each other.

However, an electrical resistance value of the first auxiliary region 644 of the first active layer 640 may be lower than that of the third auxiliary region 684 of the second active layer 680.

Since respective conductorizing processes of the active layers 640 and 680 are different, a difference in electric resistance values of the conductorized regions may occur.

As described above, the first and second regions 641 and 642 of the first active layer 640 may become conductorized through the process of performing dry etching for the first gate insulating film 650, and the third and fourth regions 681 and 682 of the second active layer 680 may become conductorized through contacting the first and second electrodes 691 and 692.

The dry etching process of the first gate insulating film 650 is a separate process in which reactive atoms separated from the plasma state meet atoms of the material of the first gate insulating film 650 that are not covered by a mask, and then, exhibit strong volatility, resulting in being separated from the corresponding surface.

In the dry etching process of the first gate insulating film 650, the first and second regions 641 and 642 of the first active layer 640 correspond to regions not covered by a mask, and thus may be exposed to plasma and become conductorized by surface treatment by plasma.

As a result, a concentration gradient of carriers occurs between the first and second regions 641 and 642 of the first active layer 640 and the first channel region 643 of the first active layer 640.

Carrier diffusion may occur from each of the first and second regions 641 and 642 having high carrier concentrations toward the first channel region 643.

A region in which carriers diffuse from the first region 641 toward the first channel region 643 may be a region corresponding to the first auxiliary region 644, and a region in which carriers diffuse from the second region 642 toward the first channel region 643 may be a region corresponding to the second auxiliary region 645.

In other words, carriers diffusing from the first region 641 or the second region 642 may be present in the first auxiliary region 644 and the second auxiliary region 645.

Further, in the dry etching process of the first gate insulating film 650, other regions of the first active layer 640 adjacent to the first region 641 and the second region 642, for example, the first and second auxiliary regions 644 and 645, may be also affected by the plasma, and, thereby, a defect in bonding of atoms may occur.

A second gate insulating film 670 may be formed on the first active layer 640, and an atmospheric gas containing hydrogen (H) may be used in the process of forming the second gate insulating film 670.

In this process, hydrogen may penetrate into the first and second auxiliary regions 644 and 645 affected by the plasma. Since hydrogen can act as a carrier in the oxide semiconductor, as the content of hydrogen included in the first and second auxiliary regions 644 and 645 increases, the mobility of the corresponding charge may increase.

In other words, the first and second auxiliary regions 644 and 645 of the first active layer 640 may contain both carriers diffusing from the first region 641 or the second region 642 and the hydrogen that is another carrier.

The third auxiliary region 684 of the second active layer 680 may include carriers diffusing from the third region 681 toward the second channel region 683, and the fourth auxiliary region 685 may include carriers diffusing from the fourth region 682 toward the second channel region 683.

That is, the first and second auxiliary regions 644 and 645 of the first active layer 640 contain hydrogen as a carrier, and may have electrical resistance values lower than electrical resistance values of the third and fourth auxiliary regions 684 and 685 of the second active layer 680.

Further, as shown in FIG. 10, as hydrogen penetrates into the first and second auxiliary regions 644 and 645, the first and second auxiliary regions 644 and 645 become larger, and as a result, a length of the first auxiliary region 641 of the first active layer 640 may be greater than a length of the third auxiliary region 681 of the second active layer 680. Here, the length of the first auxiliary region 641 and the length of the third auxiliary region 681 are based on a direction perpendicular to a direction in which the first gate insulating film 650 is stacked on the first active layer 640.

As described above, the lengths of the first and second auxiliary regions 644 and 645 may also be determined according to a location of the first gate insulating film 650.

In other words, when a tail of the first gate insulating film 650 has a relative long length, a region exposed to the plasma of the first and second auxiliary regions 644 and 645 may decrease, and thus, the amount of hydrogen penetrating into the first and second auxiliary regions 644 and 645 may decrease when the second gate insulating film 670 is formed. In this case, the lengths of the first and second auxiliary regions 644 and 645 may be shortened, and corresponding electrical resistance values may increase.

Further, when the tail of the first gate insulating film 650 has a relative short length, a region exposed to the plasma of the first and second auxiliary regions 644 and 645 may increase, and thus, the amount of hydrogen penetrating into the first and second auxiliary regions 644 and 645 may also increase when the second gate insulating film 670 is formed. In this case, the lengths of the first and second auxiliary regions 644 and 645 may be lengthened, and corresponding electrical resistance values may decrease.

Accordingly, electrical characteristics of the first active layer 640 may be adjusted through the process conditions of the first gate insulating film 650.

Next, a process of manufacturing a first thin film transistor according to aspects of the present disclosure is discussed with reference to FIGS. 11 to 15.

FIGS. 11 to 15 are diagrams for illustrating the manufacturing process of the first thin film transistor according to one embodiment of the present disclosure.

In the following description, for convenience of explanation, discussions on such a manufacturing process will be conducted by focusing on the first thin film transistor illustrated in FIG. 7A. However, it should be understood that features and implementations of the manufacturing process according to embodiments described hereinafter may be applicable to the first thin film transistor illustrated in FIGS. 6, 7B, 8.

Figure 11:
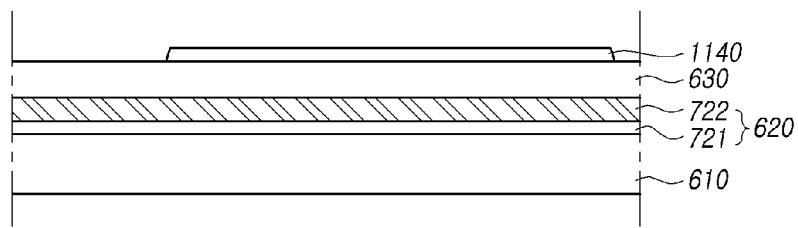
FIGS. 11 to 15 are diagrams for illustrating a manufacturing process the first thin film transistor according to one embodiment of the present disclosure.

Referring to FIG. 11, the light blocking layer 620 including a first light blocking layer 721 and a second light blocking layer 722 may be formed on the substrate 610.

Although not shown in the drawings, the light blocking layer 620 may be patterned through an exposure process using a mask.

The buffer layer 630 may be disposed on the light blocking layer 620.

A first active layer material 1140 may be disposed on the buffer layer 630. The first active layer material 1140 may include an oxide semiconductor.

The first active layer material 1140 may be patterned through an exposure process using a mask.

Thereafter, a first gate insulating film material and a gate electrode material may be formed over the substrate 610 on which the first active layer material 1140 is formed.

Figure 12:
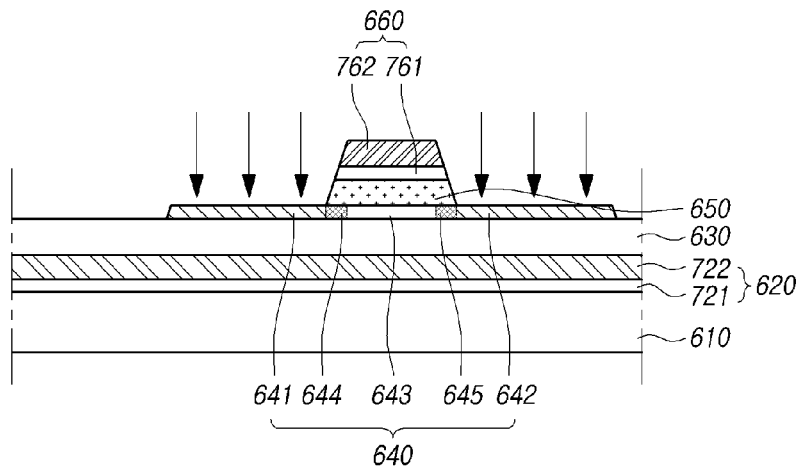

Although not shown in the drawings, the gate electrode material may be patterned through a wet etch process using a mask to become the first gate electrode 660 shown in FIG. 12. The first gate electrode 660 may include the first gate electrode 761 and the second gate electrode 762; however, embodiments of the present disclosure are not limited thereto.

Meanwhile, in the process of performing the wet etching for the gate electrode material, since the first gate electrode material covers the entire surface of the substrate 610, it is therefore possible to prevent or at least reduce the wet etching solution from penetrating the first active layer material 1140.

Thereafter, as illustrated in FIG. 12, the first gate insulating film 650 may be formed by patterning the first gate insulating film material through a dry etching process. In the process of patterning the first gate insulating film material, the first gate electrode 660 may serve as a mask.

In the process of performing the dry etching for the first gate insulating film material, one or more parts of the first active layer material may become conductorized.

Specifically, one or more parts of the first active layer material located in one or more regions corresponding to one or more regions where the first gate insulating film material is etched may become conductorized and become the first region 641 and the second region 642 of the first active layer 640.

Further, carriers in the first and second regions 641 and 642 may diffuse into the central portion of the first active layer material. Accordingly, the first auxiliary region 644 extending from the first region 641 and including a plurality of carriers, and the second auxiliary region 645 extending from the second region 642 and including a plurality of carriers may be formed in the first active layer 640.

Further, the first active layer 640 may include the first channel region 643 that is a region, into which carrier diffusion from the first and second regions 641 and 642 has not substantially performed, which locates between the first auxiliary region 644 and the second auxiliary region 645.

Figure 13:
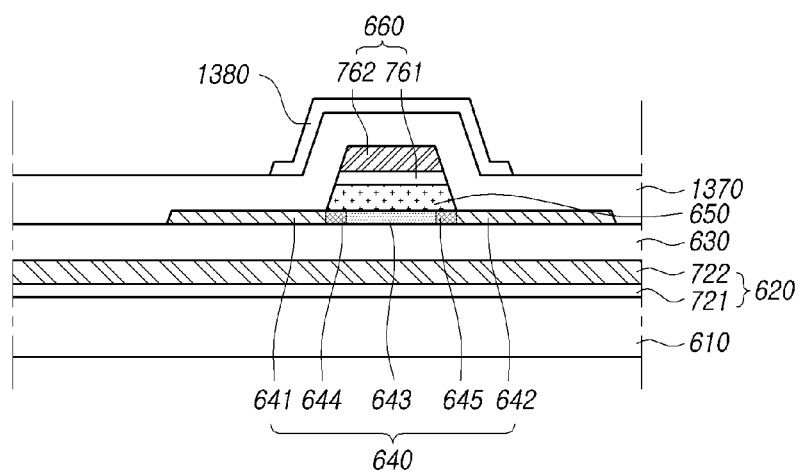

Thereafter, as illustrated in FIG. 13, a second gate insulating layer material 1370 may be formed over the substrate 610 over which the first active layer 640, the first gate insulating film 650, and the first gate electrode 660 are formed.

In the process of forming the second gate insulating film material 1370, when hydrogen (H) gas or a gas containing hydrogen (H) is used as the atmospheric gas, hydrogen (H) atoms may penetrate into the first and second auxiliary regions 644 and 645 of the first active layer 640. Further, such hydrogen (H) atoms may penetrate into the first and second regions 641 and 642.

A second active layer material 1380 may be formed on the second gate insulating film material 1370.

Thereafter, the second gate insulating layer material 1370 may be patterned through an exposure process using a mask. The second gate insulating film material 1370 remaining over the substrate 610 after the patterning process may overlap the first gate electrode 660 and the first active layer 640.

Figure 14:
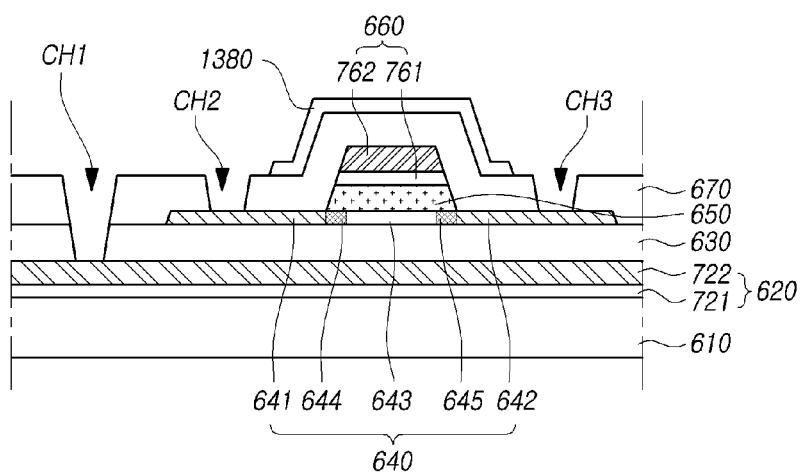

Thereafter, as illustrated in FIG. 14, a plurality of contact holes CH1, CH2, and CH3 may be formed in the second gate insulating film material 1370 by using an exposure process using a mask.

Thereafter, a first conductive layer material and a second conductive layer material are formed over the substrate 610.

Figure 15:
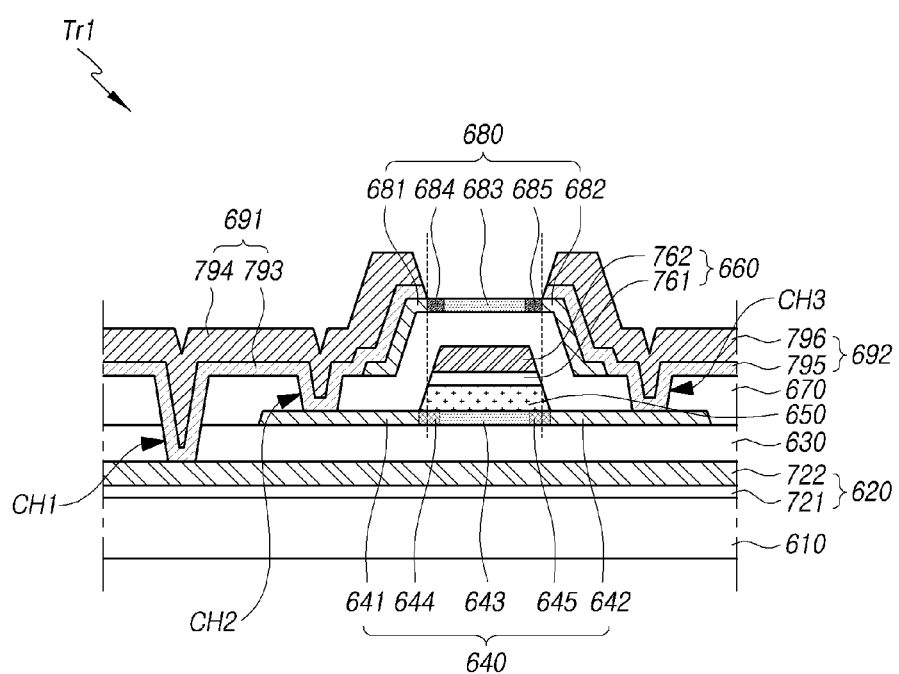

Further, as illustrated in FIG. 15, the first and second electrodes 691 and 692 may be formed by etching the first conductive layer material and the second conductive layer material through an exposure process using a mask.

The first electrode 691 and the second electrode 692 may be disposed to be spaced apart from each other, and may be formed to contact a part of the second active layer material.

A region of the second active layer material contacting the first electrode 691 may become conductorized, and thereby become the third area 681 of the second active layer 680. A region of the second active layer material contacting the second electrode 692 may become conductorized, and thereby become the fourth area 682 of the second active layer 680.

Further, carriers in the third and fourth regions 681 and 682 may diffuse into the central portion of the second active layer material. Accordingly, the third auxiliary region 684 extending from the third region 681 and including a plurality of carriers, and the fourth auxiliary region 685 extending from the fourth region 682 and including a plurality of carriers may be formed in the second active layer 680.

Further, the second active layer 680 may include the second channel region 683 that is a region, into which carrier diffusion from the third and fourth regions 681 and 682 has not substantially performed, which locates between the third auxiliary region 684 and the fourth auxiliary region 685.

Through such a process, the first thin film transistor according to embodiments described herein may be formed.

Meanwhile, when the first thin film transistor is the driving transistor illustrated in FIGS. 3 and 4, a first electrode or a second electrode of the first thin film transistor may be electrically connected to another electrode.

Such a structure is further discussed with reference to FIG. 16.

Figure 16:
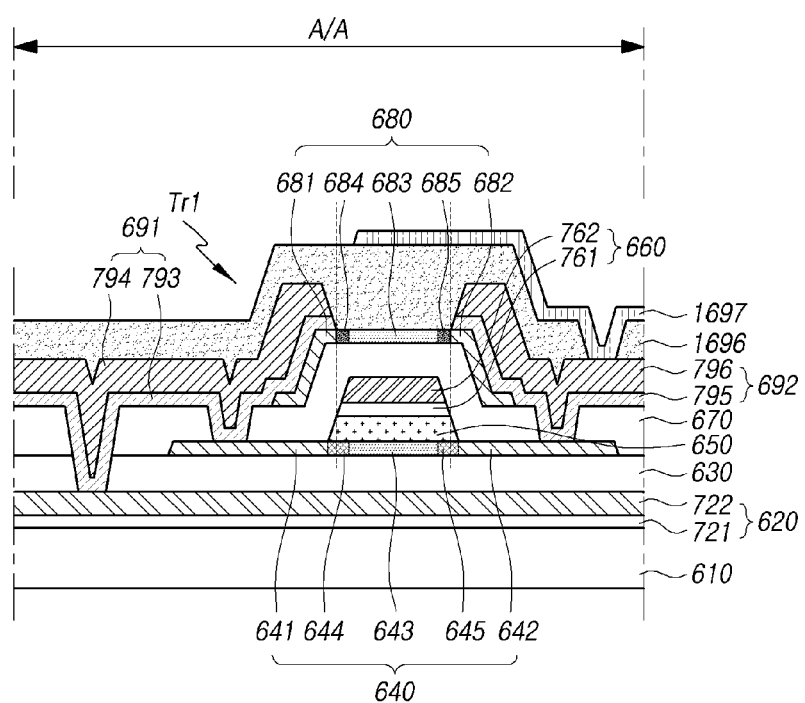
FIG. 16 illustrates a structure of a thin film transistor connected to a pixel electrode when the transistor is disposed in a sub-pixel of the panel according to one embodiment of the present disclosure.

FIG. 16 illustrates a structure of a first the thin film transistor connected to a pixel electrode when the first transistor according to aspects of the present disclosure is disposed in a sub-pixel of the panel.

In the following description, some configurations, effects etc. of the embodiments or examples discussed above may not be repeatedly described for convenience of description.

Referring to FIG. 16, at least one of first thin film transistors Tr1, of which the second electrode 692 is needed to be electrically connected to a pixel electrode 1697, which are disposed in a sub-pixel SP in the active area A/A of the panel may be present.

A passivation layer 1696 may be disposed on or over the first electrode 691, the second electrode 692, and the second gate insulating layer 670 of such a first thin film transistor Tr1.

A pixel electrode 1697 may be disposed on the passivation layer 1696. The pixel electrode 1697 may be electrically connected to the second electrode 692 of the first thin film transistor Tr1 through a contact hole formed in the passivation layer 1696.

Here, the second electrode 692 may be a source electrode or a drain electrode of the first thin film transistor Tr1.

Although FIG. 16 illustrates a configuration in which the first thin film transistor Tr1 is disposed in the active region A/A. However, embodiments of the present disclosure are not limited thereto. For example, the first thin film transistor Tr1 according to embodiments described herein may also be disposed in a non-active area N/A, which is an edge of a panel (in a case where the electronic device is a display device).

Further, although FIG. 16 illustrates a structure in which the first thin film transistor Tr1 having the structure illustrated in FIG. 7A is electrically connected to the pixel electrode 1697. However, embodiments of the present disclosure are not limited thereto. For example, at least one of the first thin film transistors Tr1 having structures according to the embodiments described herein including FIGS. 6, 7B and FIG. 8 may be electrically connected to the pixel electrode 1697.

Meanwhile, one end of the first electrode 691 of the first thin film transistor Tr1 may overlap one end of the first gate electrode 660, and one end of the second electrode 692 may overlap the other end of the first gate electrode 660, or the first electrode 691 and the second electrode 692 may not overlap the first gate electrode 660.

Accordingly, parasitic capacitance may not form between the first and second electrodes 691 and 692 and the first gate electrode 660.

As described above, the electronic device according to the embodiments of the present disclosure may include the first thin film transistor Tr1 having at least one of the structures illustrated in FIG. 6 to 8 or 16, or a film transistor having a structure different from these structures.

Figure 17:
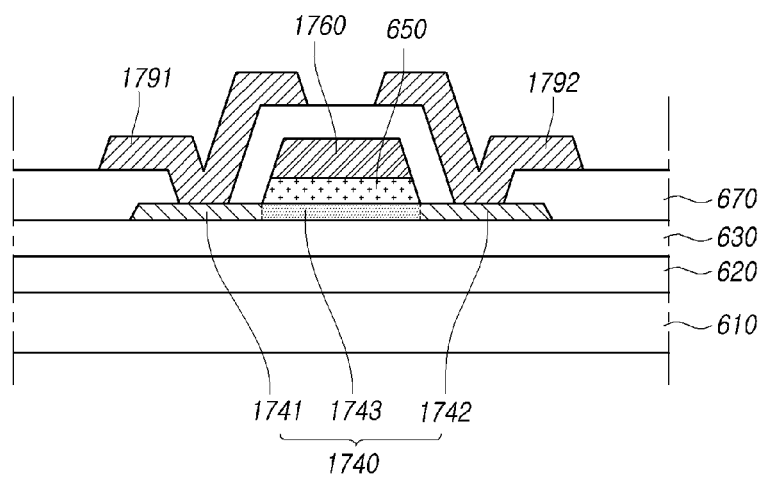
FIG. 17 illustrates a structure of a second thin film transistor according to one embodiment of the present disclosure.

FIG. 17 illustrates a structure of a second thin film transistor according to aspects of the present disclosure.

In the following description, some configurations, effects etc. of the embodiments or examples discussed above may not be repeatedly described for convenience of description.

Referring to FIG. 17, the electronic device according to aspects of the present disclosure includes a first thin film transistor Tr1 having at least one of the structures illustrated in FIG. 6, 7A, 7B, 8, or 16 described above, and further include a second thin film transistor Tr2 illustrated in FIG. 17.

The second thin film transistor Tr2 may include a third active layer 1740, a third gate electrode 1760, a third electrode 1791, and a fourth electrode 1792.

Specifically, a light blocking layer 620 made up of one or more layers may be disposed on a substrate 610.

A buffer layer 620 made up of one or more layers may be disposed on the light blocking layer 620.

A third active layer 1740 may be disposed on the buffer layer 630.

Here, the third active layer 1740 may be an oxide semiconductor. However, embodiments of the present disclosure are not limited thereto. The third active layer 1740 may be one or more of various types of semiconductors.

The third active layer 1740 may include a fifth area 1741, a sixth area 1742 spaced apart from the fifth area 1741, and a third channel region 1743 of the active layer 1740 that is located between the fifth area 1741 and the sixth area 1742.

A first gate insulating film 650 may be disposed on the third active layer 1740.

The first gate insulating film 650 may be disposed to expose a part of the third active layer 1740.

For example, the first gate insulating film 650 may be disposed to expose the fifth region 1741 and the sixth region 1742 of the third active layer 1740. The fifth region 1741 and the sixth region 1742 of the third active layer 1740 may be conductorized regions.

The third active layer 1740 may be disposed in the same layer as the first active layer of the first thin film transistor Tr1 described above.

A second gate electrode 1760 may be disposed on the second gate insulating film 650. The second gate electrode 1760 may be disposed in the same layer as the first gate electrode of the first thin film transistor Tr1 described above.

The second gate electrode 1760 may include any one of aluminum (Al), copper (Cu), molybdenum (Mo), titanium (Ti), silicon (Si), silver (Ag), gold (Au), or alloys thereof; however, embodiments of the present disclosure are not limited thereto.

The second gate electrode 1760 may overlap the third channel region 1743 of the third active layer 1740.

A second gate insulating film 670 may be disposed on the second gate electrode 1760.

A fifth electrode 1791 and a sixth electrode 1792 of the second thin film transistor Tr2 spaced apart from each other may be disposed on the second gate insulating layer 670. The fifth electrode 1791 and the sixth electrode 1792 may be disposed in the same layer as the first and second electrodes of the first thin film transistor Tr1 described above; however, embodiments of the present disclosure are not limited thereto.

The second thin film transistor Tr2 may be a thin film transistor other than a driving transistor, for example, at least one of the first and second transistors of FIGS. 3 and 4. In some embodiments, the second thin film transistor Tr2 may be applied to at least one of the pull-up transistor and the pull-down transistor of FIG. 5.

As described above, according to the embodiments described herein, it is possible to provide a thin film transistor array substrate that enables at least one thin film transistor to have high current characteristics, and an electronic device including the thin film transistor array substrate, as the at least one first thin film transistor included in the electronic device includes the first active layer, the first gate electrode disposed on the first active layer, and the second active layer disposed on the first gate electrode.

According to the embodiments described herein, it is possible to provide to a thin film transistor substrate capable of reducing the number of processes by allowing each of the first and second electrodes to contact a part of at least one active layer of the first thin film transistor, and an electronic device including the thin film transistor array substrate. Through these structures described above, since an insulating film between the second active layer and the first and second electrodes can be removed, the process of forming the first thin film transistor can be simplified.

According to the embodiments described herein, it is possible to provide to a thin film transistor array substrate that allows at least one thin film transistor having high current characteristics to occupy a smaller area, and a narrow bezel to be realized by disposing, in the non-active area, the thin film transistor including the first active layer, the first gate electrode disposed over the first active layer, and the second active layer disposed over the first gate electrode, and an electronic device including the thin film transistor array substrate.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. The above description and the accompanying drawings provide an example of the technical idea of the present invention for illustrative purposes only. That is, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. An electronic device comprising:
   a panel including at least one thin film transistor; and
   a driving circuit configured to drive the panel,
   wherein the panel comprises:
   a substrate;
   a first active layer disposed over the substrate, the first active layer including a first region, a second region spaced apart from the first region, and a first channel region disposed between the first region and the second region;
   a first gate insulating film disposed on the first active layer;
   a gate electrode disposed on the first gate insulating film;
   a second gate insulating film disposed on the gate electrode;
   a second active layer comprising at least one layer and disposed on the second gate insulating film such that the second active layer overlaps the gate electrode, the second active layer including a third region, a fourth region spaced apart from the third region, and a second channel region disposed between the third region and the fourth region;
   a first electrode disposed on the third region of the second active layer; and
   a second electrode spaced apart from the first electrode, disposed on the fourth region of the second active layer,
   wherein an entire upper surface of the third region contacts the first electrode, and an entire upper surface of the fourth region contacts the second electrode,
   wherein the second active layer includes a third auxiliary region disposed between the third region and the second channel region of the second active layer, and a fourth auxiliary region disposed between the fourth region and the second channel region of the second active layer.

2. The electronic device according to claim 1, wherein the first gate insulating film overlaps a part of the first active layer.

3. The electronic device according to claim 1, wherein the first active layer includes a first auxiliary region disposed between the first region and the first channel region of the first active layer, and a second auxiliary region disposed between the second region and the first channel region of the first active layer, and
   wherein an electrical resistance value of the first auxiliary region and an electrical resistance value of the second auxiliary region are greater than an electrical resistance value of the first region and an electrical resistance of the second region, and the electrical resistance value of the first auxiliary region and the electrical resistance value of the second auxiliary region are less than an electrical resistance value of the first channel region.

4. The electronic device according to claim 3, wherein a first end of the first auxiliary region overlaps a first end of the first gate insulating film but not the gate electrode, and a second end of the first auxiliary region overlaps the gate electrode and the first gate insulating film.

5. The electronic device according to claim 4, wherein a first end of the second auxiliary region overlaps a second end of the first gate insulating film but not the gate electrode, and a second end of the second auxiliary region overlaps the gate electrode and the first gate insulating film.

6. The electronic device according to claim 3,
   wherein an electrical resistance value of the third auxiliary region and an electrical resistance value of the fourth auxiliary region are greater than an electrical resistance value of the third region and an electrical resistance of the fourth region, and the electrical resistance value of the third auxiliary region and the electrical resistance value of the fourth auxiliary region is less than an electrical resistance value of the second channel region.

7. The electronic device according to claim 6, wherein a first end of the third auxiliary region overlaps the first end of the first gate insulating film but not the first electrode, and a second end of the third auxiliary region overlaps the gate electrode and the first gate insulating film.

8. The electronic device according to claim 7, wherein a first end of the fourth auxiliary region overlaps the second end of the first gate insulating film but not the second electrode, and a second end of the fourth auxiliary region overlaps the gate electrode and the first gate insulating film.

9. The electronic device according to claim 6, wherein a length of the third auxiliary region and a length of the fourth auxiliary region of the second active layer are less than a length of the first auxiliary region and a length of the second auxiliary region of the first active layer.

10. The electronic device according to claim 6, wherein an electrical resistance value of the third auxiliary region and an electrical resistance value of the fourth auxiliary region are greater than an electrical resistance value of the first auxiliary region and an electrical resistance value of the second auxiliary region.

11. The electronic device according to claim 6, wherein the first auxiliary region comprises first carriers diffused from the first region of the first active layer, the second auxiliary region comprises second carriers diffused from the second region of the first active layer, the third auxiliary region comprises carriers diffused from the third region of the second active layer, and the fourth auxiliary region comprises carriers diffused from the fourth region of the second active layer.

12. The electronic device according to claim 6, wherein the first auxiliary region comprises hydrogen and first carriers diffusing from the first region, and the second auxiliary region comprises the hydrogen and second carriers diffusing from the second region, while the third auxiliary region comprises third carriers diffusing from the third region, and the fourth auxiliary region comprises fourth carries diffusing from the fourth region.

13. The electronic device according to claim 1, wherein a length of the first channel region and a length of the second channel region are less than or equal to a length of the gate electrode.

14. The electronic device according to claim 1, wherein each of the first electrode and the second electrode includes titanium or an alloy including titanium.

15. The electronic device according to claim 1, wherein an end of the first electrode is aligned with a first end of the gate electrode, and
   wherein an end of the second electrode is aligned with a second end of the gate electrode.

16. The electronic device according to claim 1, wherein the first electrode and the second electrode are non-overlapping with the gate electrode.

17. The electronic device according to claim 1, wherein an oxygen concentration of the third region and an oxygen concentration of the fourth region are less than an oxygen concentration of the second channel region.

18. The electronic device according to claim 1, wherein the first active layer is comprises an oxide of zinc, indium, gallium, tin, titanium, or molybdenum, or a combination of zinc, indium, gallium, tin, titanium, or molybdenum and an oxide of zinc, indium, gallium, tin, titanium, or molybdenum, and the second active layer comprises an oxide of zinc, indium, gallium, tin, or titanium, or a combination of zinc, indium, gallium, or tin, titanium and an oxide of zinc, indium, gallium, or tin, or titanium.

19. The electronic device according to claim 1, wherein the thin film transistor is a driving transistor disposed in an active region of the panel, the active region configured to display an image.

20. The electronic device according to claim 1, wherein the thin film transistor is disposed in a non-active area disposed outside of an active region of the panel, the active area configured to display an image whereas the non-active area does not display the image.

21. The electronic device according to claim 1, wherein the first electrode is electrically connected to the first region of the first active layer through a first contact hole in the second gate insulating film, and the second electrode is electrically connected to the second region of the first active layer through a second contact hole in the second gate insulating film.

22. The electronic device according to claim 1, wherein the first electrode contacts an entirety of an upper surface of the third region of the second active layer and one or more side surfaces of the third region, and
    the second electrode contacts an entirety of an upper surface of the fourth region of the second active layer, and one or more side surfaces of the fourth region.

23. The electronic device according to claim 1, wherein an oxygen vacancy concentration of the third auxiliary region and an oxygen vacancy concentration of the fourth auxiliary region are more than an oxygen vacancy concentration of the second channel region.

\* \* \* \* \*